United States Patent
Azuma et al.

(10) Patent No.: US 12,394,455 B2
(45) Date of Patent: Aug. 19, 2025

(54) MEMORY SYSTEM AND NON-VOLATILE MEMORY USING SOFT BIT DATA INFORMATION TO IMPROVE MEMORY OPERATION

(71) Applicant: Kioxia Corporation, Tokyo (JP)

(72) Inventors: Keisuke Azuma, Tokyo (JP); Mitsuaki Honma, Fujisawa (JP); Daisuke Arizono, Yokohama (JP)

(73) Assignee: Kioxia Corporation, Tokyo (JP)

( * ) Notice: Subject to any disclaimer, the term of this patent is extended or adjusted under 35 U.S.C. 154(b) by 122 days.

(21) Appl. No.: 17/931,945

(22) Filed: Sep. 14, 2022

(65) Prior Publication Data

US 2023/0170004 A1    Jun. 1, 2023

(30) Foreign Application Priority Data

Nov. 26, 2021    (JP) .............................. 2021-191709

(51) Int. Cl.
| | | |
|---|---|---|
| G11C 7/06 | (2006.01) | |
| G06F 12/02 | (2006.01) | |
| G11C 7/10 | (2006.01) | |
| G11C 7/12 | (2006.01) | |
| G11C 29/52 | (2006.01) | |

(52) U.S. Cl.
CPC ........ G11C 7/1069 (2013.01); G06F 12/0246 (2013.01); G11C 7/06 (2013.01); G11C 7/12 (2013.01)

(58) Field of Classification Search
CPC ........... G11C 7/1069; G11C 7/06; G11C 7/12; G11C 29/52; G11C 2029/0409; G11C 2029/0411; G11C 16/02; G11C 29/42; G06F 12/0246
See application file for complete search history.

(56) References Cited

U.S. PATENT DOCUMENTS

| | | |
|---|---|---|
| 8,874,994 B2 | 10/2014 | Sharon et al. |
| 9,190,161 B2 | 11/2015 | Shibata |
| 9,214,965 B2 * | 12/2015 | Fitzpatrick .......... G06F 11/1012 |
| 10,847,230 B2 | 11/2020 | Ando et al. |
| 2010/0223538 A1 | 9/2010 | Sakurada |
| 2013/0051141 A1 | 2/2013 | Moschiano et al. |

(Continued)

FOREIGN PATENT DOCUMENTS

| | | |
|---|---|---|
| JP | 4818381 B2 | 11/2011 |
| JP | 2014-157650 A | 8/2014 |

(Continued)

*Primary Examiner* — Khamdan N. Alrobaie
*Assistant Examiner* — Elizabeth Rose Agger
(74) *Attorney, Agent, or Firm* — Oblon, McClelland, Maier & Neustadt, L.L.P.

(57) ABSTRACT

According to an embodiment, a memory system comprising: a non-volatile memory including a plurality of memory cells each capable of storing at least a first bit and a second bit, and configured to calculate third soft bit data based on a logical sum calculation using at least first soft bit data corresponding to the first bit and second soft bit data corresponding to the second bit; and a memory controller configured to restore the first soft bit data and the second soft bit data based on at least first hard bit data corresponding to the first bit, second hard bit data corresponding to the second bit, and the third soft bit data.

20 Claims, 24 Drawing Sheets

(56) References Cited

U.S. PATENT DOCUMENTS

| | | | |
|---|---|---|---|
| 2013/0077400 A1* | 3/2013 | Sakurada | G11O 16/06 |
| | | | 365/185.03 |
| 2013/0135927 A1* | 5/2013 | Jeon | G11O 11/5642 |
| | | | 365/185.03 |
| 2014/0237318 A1 | 8/2014 | Fitzpatrick et al. | |
| 2017/0046220 A1 | 2/2017 | Sharon et al. | |
| 2017/0186484 A1 | 6/2017 | Takada et al. | |
| 2021/0211142 A1 | 7/2021 | Hyodo et al. | |

FOREIGN PATENT DOCUMENTS

| | | | | |
|---|---|---|---|---|
| JP | 6025844 B2 | 11/2016 | | |
| JP | 2020-47312 A | 3/2020 | | |
| JP | 2021-111826 A | 8/2021 | | |
| TW | 201314449 A1 | 4/2013 | | |
| WO | WO2005062494 A1 * | 7/2005 | | H04B 7/022 |

* cited by examiner

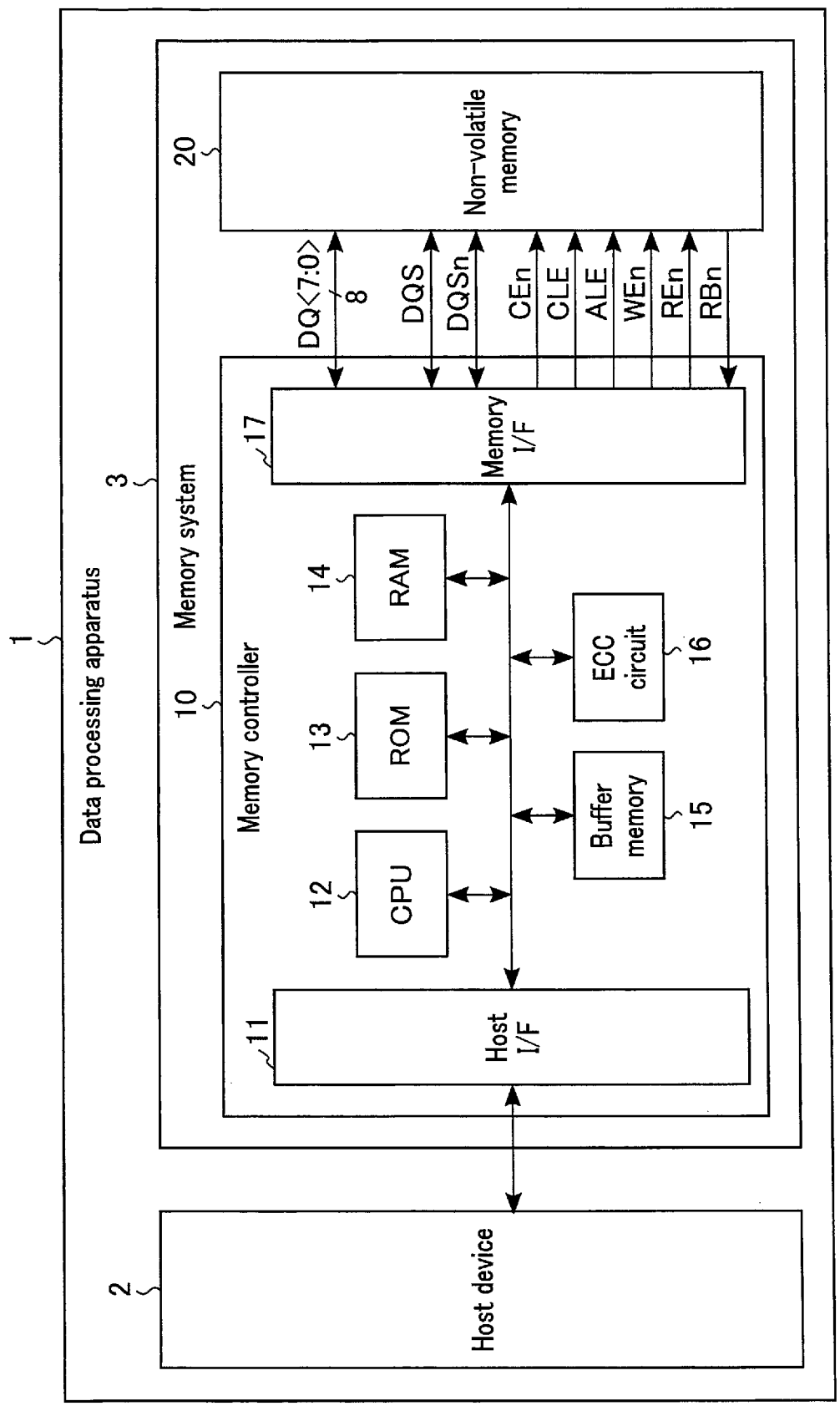
F I G. 1

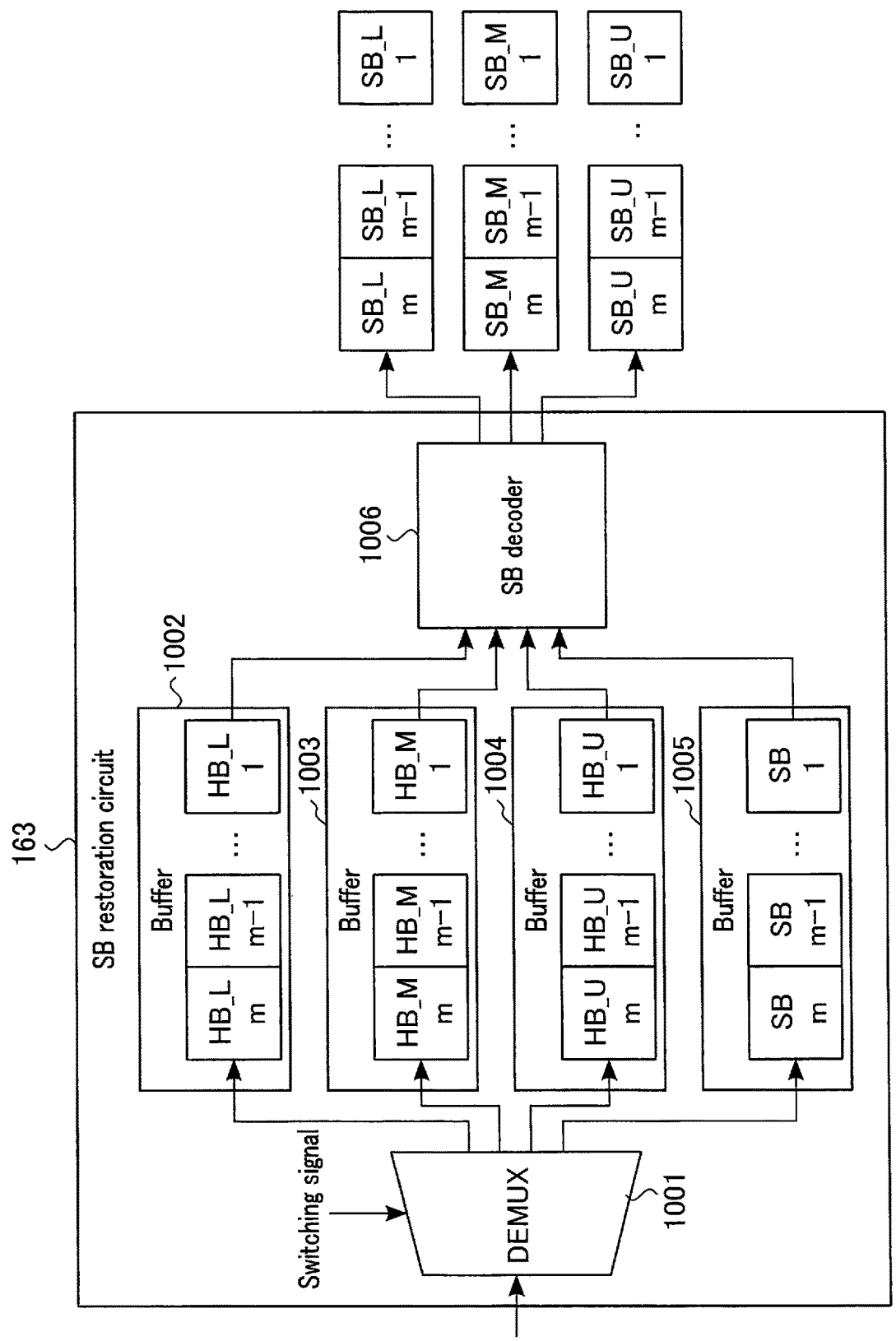
F I G. 3

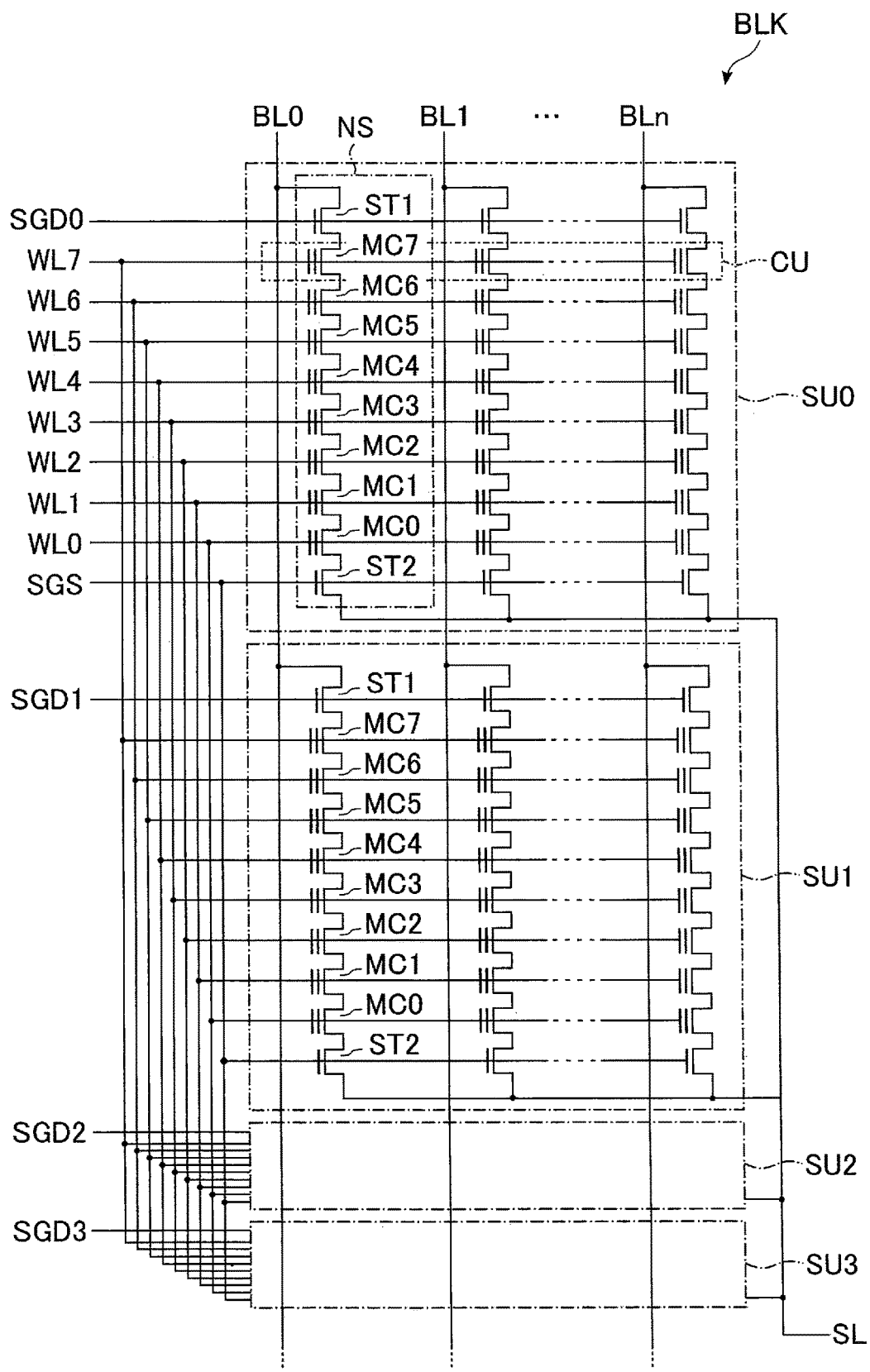
F I G. 5

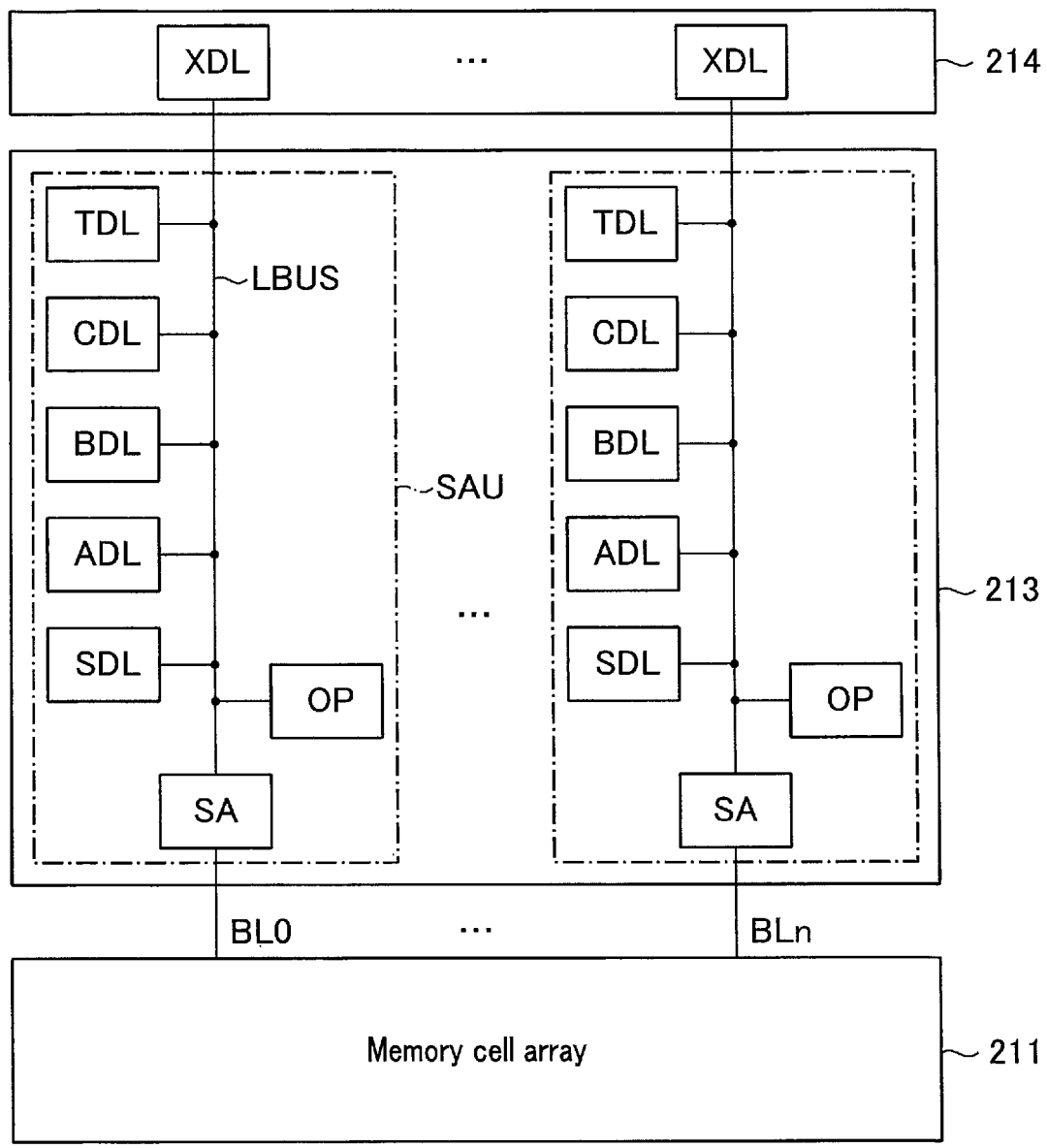
F I G. 6

| | Er | A | B | C | D | E | F | G |
|---|---|---|---|---|---|---|---|---|
| HB_L | 1 | 0 | 0 | 0 | 0 | 1 | 1 | 1 |
| HB_M | 1 | 1 | 0 | 0 | 1 | 1 | 0 | 0 |
| HB_U | 1 | 1 | 1 | 0 | 0 | 0 | 0 | 1 |
| Compressed SB | 0 | 1 | 0 | 1 | 0 | 0 | 1 | 0 |

SB_L=((~L&M&~U)|(L&M&~U))&SB

| | Er | A | B | C | D | E | F | G |
|---|---|---|---|---|---|---|---|---|
| SB_L | 0 | 1 | 0 | 0 | 0 | 1 | 0 | 0 |

SB_M=((~L&~M&U)|(~L&M&~U)|(L&~M&U))&SB

| | Er | A | B | C | D | E | F | G |
|---|---|---|---|---|---|---|---|---|
| SB_M | 0 | 0 | 1 | 0 | 1 | 0 | 1 | 0 |

SB_U=((~L&~M&U)|(L&M&U))&SB

| | Er | A | B | C | D | E | F | G |
|---|---|---|---|---|---|---|---|---|
| SB_U | 0 | 0 | 0 | 1 | 0 | 0 | 0 | 1 |

FIG. 12

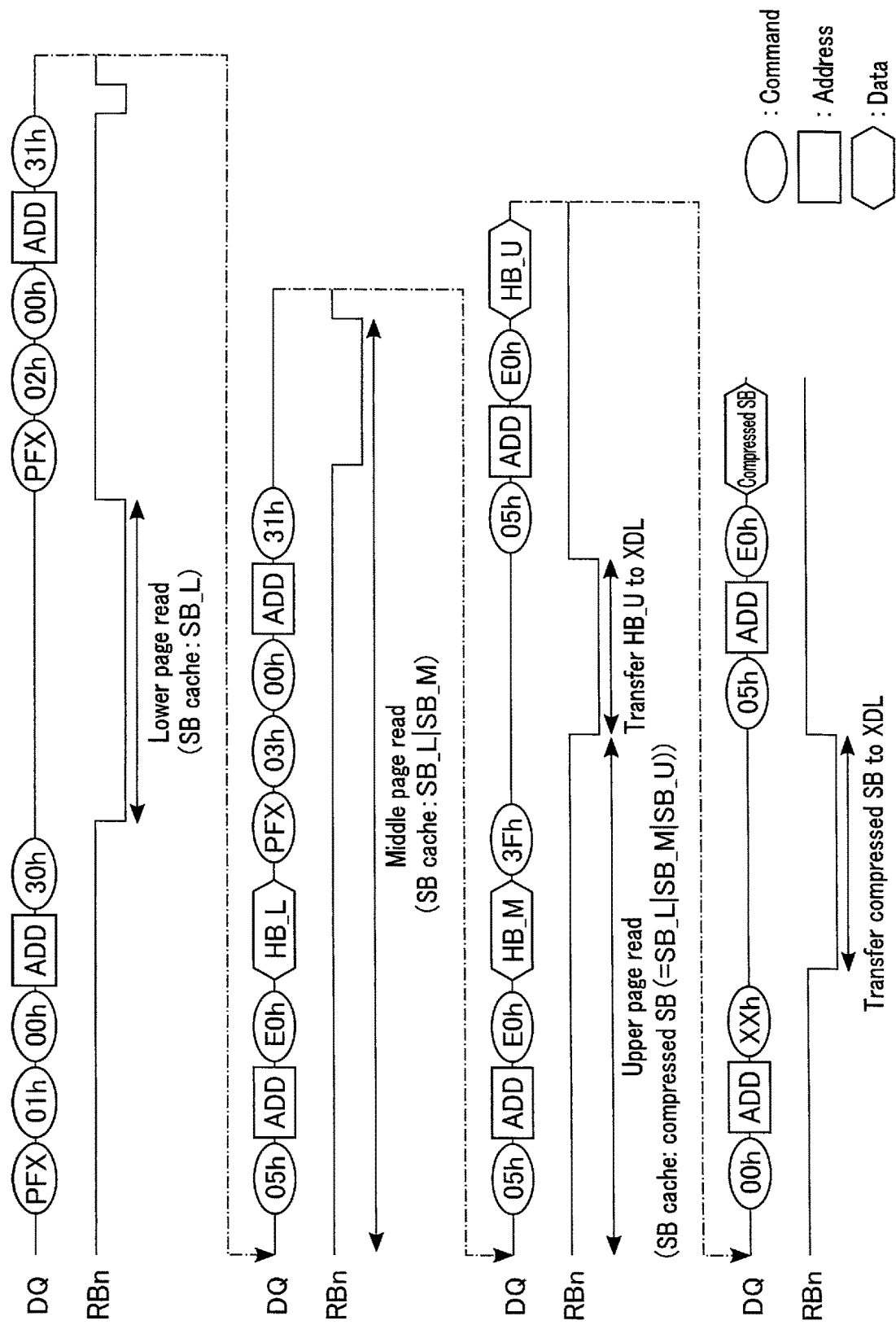
F I G. 15

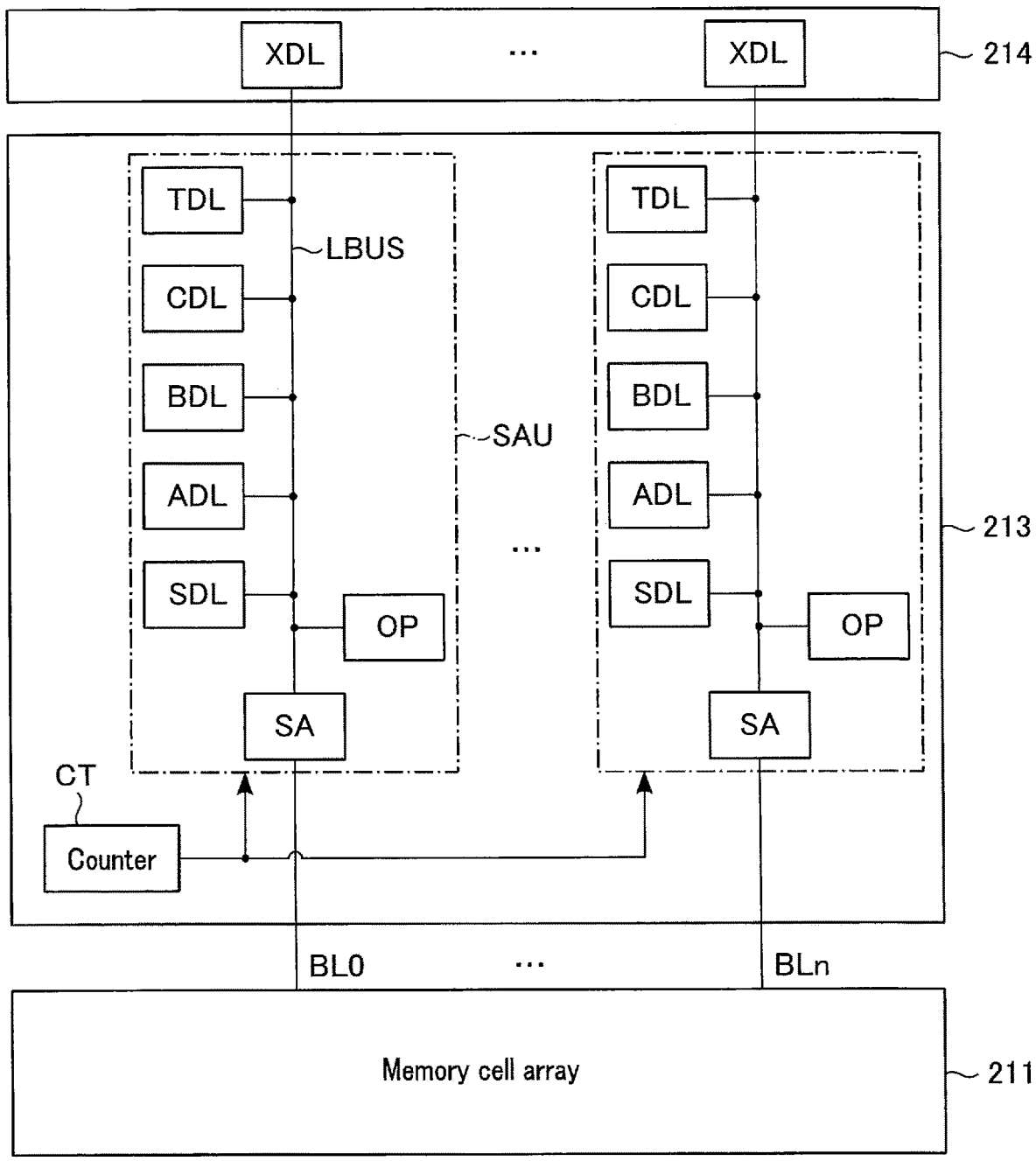
F I G. 18

MEMORY SYSTEM AND NON-VOLATILE MEMORY USING SOFT BIT DATA INFORMATION TO IMPROVE MEMORY OPERATION

CROSS-REFERENCE TO RELATED APPLICATIONS

This application is based upon and claims the benefit of priority from Japanese Patent Application No. 2021-191709, filed Nov. 26, 2021, the entire contents of which are incorporated herein by reference.

FIELD

Embodiments described herein relate generally to a memory system and a non-volatile memory.

BACKGROUND

A memory system equipped with a non-volatile memory such as a NAND flash memory is known.

BRIEF DESCRIPTION OF THE DRAWINGS

FIG. 1 is a block diagram illustrating an overall configuration of a data processing apparatus including a memory system according to a first embodiment.

FIG. 3 is a block diagram illustrating a configuration of an SB restoration circuit included in the memory system according to the first embodiment.

FIG. 5 is a circuit diagram of a memory cell array included in the non-volatile memory according to the first embodiment.

FIG. 6 is a block diagram of a data register and a sense amplifier included in the non-volatile memory according to the first embodiment.

FIG. 12 is a diagram illustrating restoration processing of soft bit data SB_L, SB_M, and SB_U in the memory system according to the first embodiment.

FIG. 15 is a command sequence of a second read mode in the memory system according to the first embodiment.

FIG. 18 is a block diagram of a data register and a sense amplifier included in a non-volatile memory according to a third embodiment.

DETAILED DESCRIPTION

Figure 2:
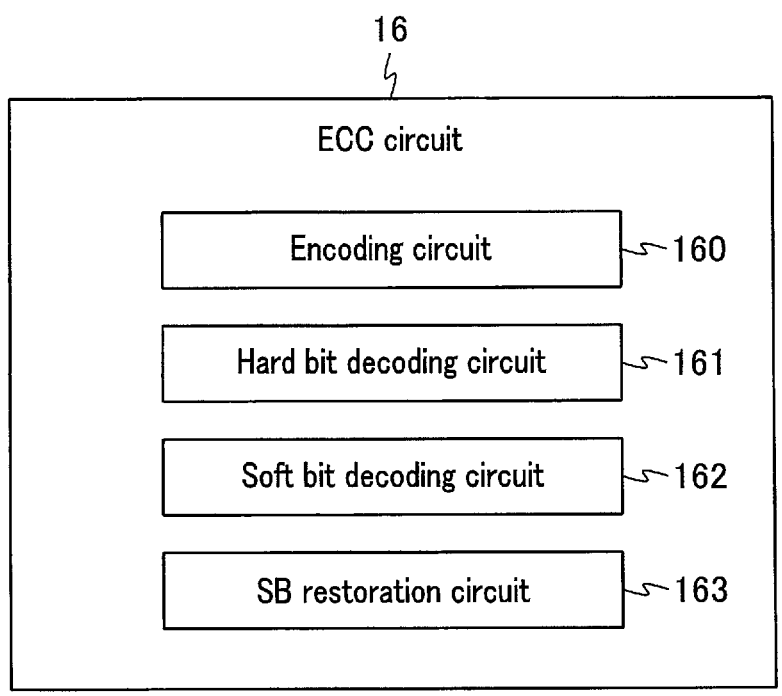
FIG. 2 is a block diagram illustrating a configuration of an ECC circuit included in the memory system according to the first embodiment.

In general, according to one embodiment, a memory system comprising: a non-volatile memory including a plurality of memory cells each capable of storing at least a first bit and a second bit, and configured to calculate third soft bit data based on a logical sum calculation using at least first soft bit data corresponding to the first bit and second soft bit data corresponding to the second bit; and a memory controller configured to restore the first soft bit data and the second soft bit data based on at least first hard bit data corresponding to the first bit, second hard bit data corresponding to the second bit, and the third soft bit data.

Hereinafter, embodiments will be described with reference to the drawings. The drawings are schematic. Note that, in the following description, components having substantially the same functions and configurations are denoted by the same reference numerals. Numbers after characters constituting the reference numerals are used to distinguish elements having similar configurations.

1. First Embodiment

1.1 Configuration

1.1.1 Configuration of Data Processing Apparatus

First, an example of a configuration of a data processing apparatus 1 including a memory system will be described with reference to FIG. 1. FIG. 1 is a block diagram illustrating an overall configuration of the data processing apparatus 1. Note that, in the example of FIG. 1, a part of coupling between components is indicated by an arrow line, but the coupling between the components is not limited thereto.

As illustrated in FIG. 1, the data processing apparatus 1 includes a host device 2 and a memory system 3. Note that a plurality of memory systems 3 may be coupled to the host device 2.

The host device 2 is an information processing apparatus (computing device) that accesses the memory system 3. The host device 2 controls the memory system 3. More specifically, for example, the host device 2 requests (instructs) the memory system 3 to perform a write operation or a read operation of data (hereinafter, referred to as "user data").

The memory system 3 is, for example, a solid state drive (SSD). The memory system 3 is coupled to the host device 2.

1.1.2 Configuration of Memory System

Subsequently, an example of a configuration of the memory system 3 will be described with reference to FIG. 1.

As illustrated in FIG. 1, the memory system 3 includes a memory controller 10 and a non-volatile memory 20.

In response to a request (instruction) from the host device 2, the memory controller 10 instructs the non-volatile memory 20 to perform a read operation, a write operation, an erase operation, and the like. In addition, the memory controller 10 manages a memory space of the non-volatile memory 20.

The non-volatile memory 20 is, for example, a NAND flash memory. The NAND flash memory includes a plurality of blocks. The block is, for example, a unit of erasing data, and data in the same block is collectively erased. Each block includes a plurality of memory cell transistors (hereinafter, also written as "memory cells") that stores data in a non-volatile manner. Note that the memory system 3 can include a plurality of non-volatile memories 20.

Next, an internal configuration of the memory controller 10 will be described. The memory controller 10 includes a host interface circuit (host I/F) 11, a central processing unit (CPU) 12, a read only memory (ROM) 13, a random access memory (RAM) 14, a buffer memory 15, an error check and correction (ECC) circuit 16, and a memory interface circuit (memory I/F) 17. These circuits are coupled to each other by, for example, a bus. Note that each function of the memory controller 10 may be realized by a dedicated circuit or may be realized by the CPU 12 executing firmware.

The host interface circuit 11 is a hardware interface circuit coupled to the host device 2. The host interface circuit 11 performs communication according to an interface standard between the host device 2 and the memory controller 10. The host interface circuit 11 transmits the request and the user data received from the host device 2 to the CPU 12 and the buffer memory 15, respectively. In addition, the host interface circuit 11 transmits the user data in the buffer memory 15 to the host device 2 in response to an instruction from the CPU 12.

The CPU 12 is a processor. The CPU 12 controls the entire operation of the memory controller 10. For example, the CPU 12 instructs the non-volatile memory 20 to perform a write operation, a read operation, and an erase operation based on the request received from the host device 2.

In addition, the CPU 12 executes various processing for managing the non-volatile memory 20 such as garbage collection operation, refresh operation, wear leveling operation, and patrol read operation in the background, in addition to the processing of instructing the non-volatile memory 20 to perform a predetermined operation based on the request received from the host device 2. Further, the CPU 12 executes various calculations such as data encryption processing and randomization processing.

The garbage collection operation is also referred to as compaction operation. In the non-volatile memory 20, since a data erasing unit and a data reading/writing unit are different, blocks are fragmented due to invalid data as rewriting of the non-volatile memory 20 progresses, and as the number of such fragmented blocks increases, the number of usable blocks decreases. The garbage collection operation is processing for increasing the number of usable blocks, and means, for example, processing of collecting valid data from a plurality of active blocks including valid data and invalid data, rewriting the valid data to another block, and securing a free block.

The active block indicates a block in which valid data is recorded. The free block indicates a block in which valid data is not recorded. The free block can be reused as an erased block after being erased. In the present embodiment, the free block includes both a block before erasing in which valid data is not recorded and an erased block. The valid data is data associated with a logical address, and the invalid data is data not associated with the logical address. The erased block becomes an active block when data is written.

The refresh operation is processing of rewriting data in a certain block to another block when deterioration of data in the block is detected, for example, when the number of correction bits in error correction processing by an ECC circuit 16 increases.

The wear leveling operation is, for example, processing of leveling the number of writing of the blocks of the non-volatile memory 20 by exchanging data stored in a block having the relatively large number of writing or erasing with data stored in a block having the relatively small number of writing or erasing.

The patrol read operation is, for example, processing of reading data stored in the non-volatile memory 20 by a predetermined unit and testing the read data based on an error correction result in the ECC circuit 16 in order to detect a block with an increased error. In this test processing, for example, the number of error bits of the read data is compared with a threshold, and data in which the number of error bits exceeds the threshold is set as a refresh target.

The ROM 13 is a non-volatile memory. For example, the ROM 13 is an electrically erasable programmable read-only memory (EEPROM (trademark)). The ROM 13 is a non-transitory storage medium that stores firmware, programs, and the like. For example, the operation of the memory controller 10 described later is realized by the CPU 12 executing the firmware of the ROM 13.

The RAM 14 is a volatile memory. The RAM 14 is a dynamic random access memory (DRAM), a static random access memory (SRAM), or the like. The RAM 14 is used as a work area of the CPU 12. The RAM 14 stores firmware for managing the non-volatile memory 20, various management tables, and the like.

The buffer memory 15 is a volatile memory. The buffer memory 15 is a DRAM, an SRAM, or the like. The buffer memory 15 temporarily stores data read from the non-volatile memory 20 by the memory controller 10, user data received from the host device 2, and the like.

The ECC circuit 16 is a circuit that executes ECC processing. The ECC processing includes encoding and decoding of data. The ECC circuit 16 encodes data to be written to the non-volatile memory 20. An encoding method uses a Bose-Chaudhuri-Hocquenghem (BCH) code, a Reed-Solomon (RS) code, a Low-Density Parity-Check (LDPC) code, or the like. The ECC circuit 16 decodes data read from the non-volatile memory 20. That is, the ECC circuit 16 executes error correction of data. A configuration of the ECC circuit 16 will be described later.

The memory interface circuit 17 is a hardware interface circuit coupled to the non-volatile memory 20. The memory interface circuit 17 performs communication according to an interface standard between the memory controller 10 and the non-volatile memory 20. The memory interface circuit 17 transmits and receives data and various signals to and from the non-volatile memory 20 under the control of the CPU 12.

More specifically, the memory interface circuit 17 transmits and receives, for example, 8-bit signals DQ <7:0> and clock signals DQS and DQSn to and from the non-volatile memory 20. The signal DQ<7:0> is, for example, data, an address, and a command. Hereinafter, when any of the signals DQ<7:0> is not limited, it is written as a signal DQ. The clock signals DQS and DQSn are clock signals used at the time of inputting and outputting data. The clock signal DQSn is an inverted signal of the clock signal DQS.

In addition, the memory interface circuit 17 transmits a chip enable signal CEn, a command latch enable signal CLE, an address latch enable signal ALE, a write enable signal WEn, and a read enable signal REn to the non-volatile memory 20. Then, the memory interface circuit 17 receives a ready/busy signal RBn from the non-volatile memory 20.

The chip enable signal CEn is a signal for enabling the non-volatile memory 20 and is asserted at a low ("L") level, for example. The command latch enable signal CLE is a signal indicating that the signal DQ is a command, and is asserted at a high ("H") level, for example. The address latch enable signal ALE is a signal indicating that the signal DQ is an address, and is asserted at the "H" level, for example.

The write enable signal WEn is a signal for fetching the received signal into the non-volatile memory 20. The signal WEn is asserted at the "L" level, for example, at timing when the non-volatile memory 20 fetches the command and the address. Therefore, every time the signal WEn is toggled, the command and the address are fetched into the non-volatile memory 20.

The read enable signal REn is a signal for the memory controller 10 to read data from the non-volatile memory 20. The signal REn is asserted at the "L" level, for example. For example, the non-volatile memory 20 generates the signals DQS and DQSn based on the signal REn at the time of data output.

The ready/busy signal RBn is a signal indicating whether the non-volatile memory 20 is in a state of being incapable of receiving the signal DQ from the memory controller 10 or in a state of being capable of receiving the signal DQ. For example, the ready/busy signal RBn is set to the "L" level when the non-volatile memory 20 is in a busy state.

1.1.3 Configuration of ECC Circuit

Next, an example of a configuration of the ECC circuit 16 will be described with reference to FIG. 2. FIG. 2 is a block diagram illustrating the configuration of the ECC circuit 16.

As illustrated in FIG. 2, the ECC circuit 16 includes an encoding circuit 160, a hard bit decoding circuit 161, a soft bit decoding circuit 162, and an SB restoration circuit 163.

The encoding circuit 160 is a circuit that encodes data. For example, when the encoding circuit 160 receives a write request from the host device 2, the encoding circuit 160 generates an error correction code (parity) used for ECC processing from the user data. The encoding circuit 160 gives the parity to the user data. This is also written as encoding. Therefore, the write data includes the user data and the parity.

The hard bit decoding circuit 161 is a circuit that performs hard bit decoding of read data. The hard bit decoding is ECC processing using a hard bit decoding value received (read) from the non-volatile memory 20. Hereinafter, the hard bit decoding value is also written as a hard bit. The hard bit will be described later. Hard bit data is input to the hard bit decoding circuit 161. The hard bit decoding circuit 161 decodes the user data based on the hard bit data.

The soft bit decoding circuit 162 is a circuit that performs soft bit decoding of read data. The soft bit decoding is ECC processing using a soft bit decoding value received (read) from the non-volatile memory 20. Hereinafter, the soft bit decoding value is also written as a soft bit. The soft bit will be described later. Hard bit data and soft bit data are input to the soft bit decoding circuit 162. The soft bit decoding circuit 162 decodes the user data based on the hard bit data and the soft bit data. In decoding, the soft bit decoding circuit 162 uses a log-likelihood ratio (LLR) table. The LLR table is a table indicating a correspondence between the soft bit and the log-likelihood ratio. The LLR table includes log-likelihood ratio values (LLR values). The LLR value is information in which the likelihood when the data is "0" and the likelihood when the data is "1" are expressed by a logarithmic ratio. The LLR value indicates reliability (likelihood) of data read by a certain read voltage. For example, the LLR table is read from the non-volatile memory 20 to the memory controller 10 at the time of starting of the memory system 3 and stored in the RAM 14.

The SB restoration circuit 163 is a circuit that restores the soft bit data. The non-volatile memory 20 of the present embodiment transmits compressed soft bit data to the memory controller 10. The compressed soft bit data is data obtained by compressing a plurality of pieces of soft bit data. The compressed soft bit data will be described later. The SB restoration circuit 163 restores a plurality of pieces of soft bit data using the hard bit data and the compressed soft bit data.

An example of restoration of the soft bit data will be described. For example, the memory cell transistor of the non-volatile memory 20 is a triple level cell (TLC) that stores 3-bit data including a lower bit, a middle bit, and an upper bit. In this case, the non-volatile memory 20 compresses (integrates) 3-bit soft bit data corresponding to the lower bit, the middle bit, and the upper bit to calculate 1-bit compressed soft bit data. The SB restoration circuit 163 restores the soft bit data of the lower bit, the soft bit data of the middle bit, and the soft bit data of the upper bit from the hard bit data of the lower bit, the hard bit data of the middle bit, the hard bit data of the upper bit, and the compressed soft bit data read from the non-volatile memory 20.

1.1.4 Configuration of SB Restoration Circuit

Next, an example of a configuration of the SB restoration circuit 163 will be described with reference to FIG. 3. FIG. 3 is a block diagram illustrating the configuration of the SB restoration circuit 163. Note that the SB restoration circuit 163 illustrated in FIG. 3 corresponds to a case where the memory cell transistor is a TLC.

As illustrated in FIG. 3, the SB restoration circuit 163 includes a demultiplexer (DEMUX: De-Multiplexer) 1001, four buffers 1002 to 1005, and an SB decoder 1006. Note that the number of buffers is arbitrarily set based on the number of bits that can be stored in the memory cell transistor. For example, when the number of bits that can be stored in the memory cell transistor is k (k is an integer of 2 or more), the SB restoration circuit 163 may include k+1 buffers.

The DEMUX 1001 is a coupling circuit. The DEMUX 1001 electrically couples an input terminal and one of four output terminals coupled to the buffers 1002 to 1005, respectively, based on a switching signal received from the CPU 12.

The buffer 1002 temporarily stores hard bit data HB_L of the lower bit. The buffer 1002 receives the hard bit data HB_L from the DEMUX 1001. For example, the buffer 1002 stores the hard bit data HB_L having a data length of m bits (m is an integer of 1 or more). Note that the data length that can be stored in the buffer 1002 may be the same as or different from a data length (hereinafter, written as an "ECC frame") that is collectively subjected to the ECC processing.

The buffer 1003 is a buffer that temporarily stores hard bit data HB_M of the middle bit. The buffer 1003 receives the hard bit data HB_M from the DEMUX 1001. For example, similarly to the buffer 1002, the buffer 1003 stores the hard bit data HB_M having a data length of m bits.

The buffer 1004 is a buffer that temporarily stores hard bit data HB_U of the upper bit. The buffer 1004 receives the hard bit data HB_U from the DEMUX 1001. For example, similarly to the buffer 1002, the buffer 1004 stores the hard bit data HB_U having a data length of m bits.

The buffer 1005 is a buffer that temporarily stores the compressed soft bit data SB. The buffer 1005 receives the compressed soft bit data SB from the DEMUX 1001. For example, similarly to the buffer 1002, the buffer 1005 stores the compressed soft bit data SB having a data length of m bits.

The SB decoder 1006 is a restoration circuit of the soft bit data SB. The SB decoder 1006 receives the hard bit data HB_L, HB_M, and HB_U and the compressed soft bit data SB. The SB decoder 1006 restores soft bit data SB_L of the lower bit, soft bit data SB_M of the middle bit, and soft bit data SB_U of the upper bit based on the hard bit data HB_L, HB_M, and HB_U and the compressed soft bit data SB. For example, the SB decoder 1006 transmits the soft bit data SB_L, SB_M, and SB_U to the soft bit decoding circuit 162.

1.1.5 Configuration of Non-Volatile Memory

Figure 4:
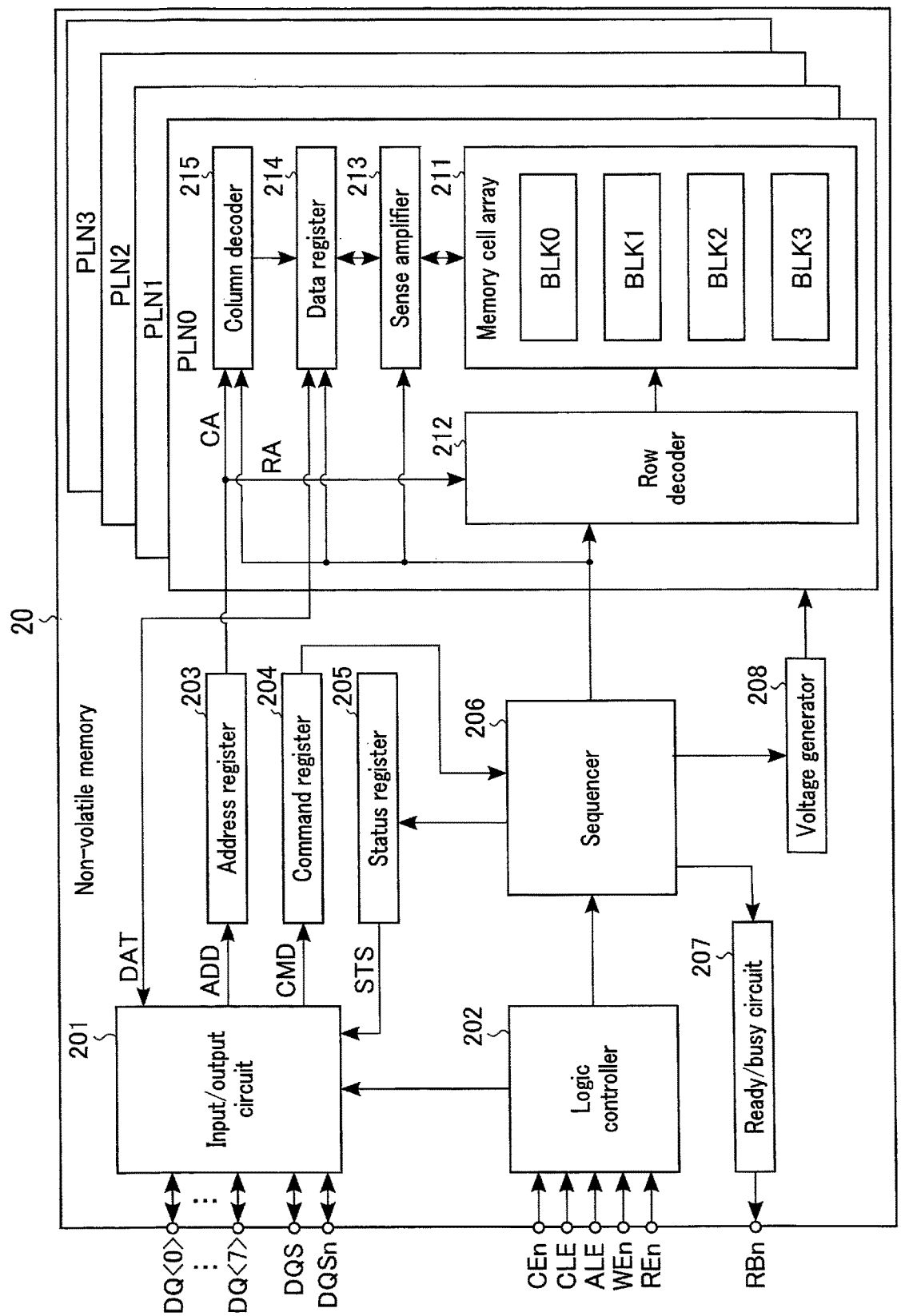
FIG. 4 is a block diagram illustrating a basic configuration of a non-volatile memory according to the first embodiment.

Next, an example of a configuration of the non-volatile memory 20 will be described with reference to FIG. 4. FIG. 4 is a block diagram illustrating a basic configuration of the non-volatile memory 20. Note that, in the example of FIG. 4, a part of coupling of components is indicated by an arrow line. However, the coupling between the components is not limited thereto.

As illustrated in FIG. 4, the non-volatile memory 20 is, for example, a NAND flash memory. The non-volatile memory 20 is coupled to the memory controller 10. The non-volatile memory 20 operates based on an instruction from the memory controller 10.

The non-volatile memory 20 includes an input/output circuit 201, a logic controller 202, an address register 203, a command register 204, a status register 205, a sequencer 206, a ready/busy circuit 207, a voltage generator 208, and a plurality of planes PLN.

The input/output circuit 201 is a circuit that inputs and outputs the signal DQ. The input/output circuit 201 is coupled to the memory controller 10. In addition, the input/output circuit 201 is coupled to the address register 203, the command register 204, the status register 205, and a data register 214 of each plane PLN. In a case where the input signal DQ is data DAT, the input/output circuit 201 receives the input signal DQ based on the clock signals DQS and DQSn. Then, the input/output circuit 201 transmits the data DAT to the data register 214 of the corresponding plane PLN. In addition, the input/output circuit 201 outputs the data DAT and the status information STS to the memory controller 10 together with the clock signals DQS and DQSn. When the input signal DQ is an address ADD, the input/output circuit 201 transmits the address ADD to the address register 203. When the input signal DQ is a command CMD, the input/output circuit 201 transmits the command CMD to the command register 204.

The logic controller 202 is a circuit that performs logic control based on a control signal. The logic controller 202 is coupled to the memory controller 10. In addition, the logic controller 202 is coupled to the input/output circuit 201 and the sequencer 206. The logic controller 202 receives various control signals from the memory controller 10. The logic controller 202 controls the input/output circuit 201 and the sequencer 206 based on the received control signal.

The address register 203 is a register that temporarily stores the address ADD. The address register 203 is coupled to a row decoder 212 and a column decoder 215 of each plane PLN. The address ADD includes a row address RA and a column address CA. The address register 203 transmits the row address RA to the row decoder 212. Further, the address register 203 transmits the column address CA to the column decoder 215.

The command register 204 is a register that temporarily stores the command CMD. The command register 204 is coupled to the sequencer 206. The command register 204 transmits the command CMD to the sequencer 206.

The status register 205 is a register that temporarily stores the status information STS. The status register 205 is coupled to the sequencer 206. The status register 205 temporarily stores the status information STS in the write operation, the read operation, the erase operation, and the like. The status information STS is transmitted to the memory controller 10 via the input/output circuit 201.

The sequencer 206 controls the entire operation of the non-volatile memory 20. More specifically, the sequencer 206 controls the ready/busy circuit 207, the voltage generator 208, the row decoder 212, the sense amplifier 213, the data register 214, the column decoder 215, and the like. The sequencer 206 executes the write operation, the read operation, and the erase operation based on the command CMD. The sequencer 206 transmits the status information STS to the status register 205.

The ready/busy circuit 207 is a circuit that transmits a ready/busy signal RBn. The ready/busy circuit 207 transmits the ready/busy signal RBn to the memory controller 10 according to an operation status of the sequencer 206.

The voltage generator 208 generates various voltages used for the write operation, the read operation, and the erase operation based on the control of the sequencer 206. The voltage generator 208 supplies voltages to the memory cell array 211, the row decoder 212, the sense amplifier 213, the data register 214, the column decoder 215, and the like of each plane PLN.

The plane PLN is a unit that performs the write operation, the read operation, and the erase operation of data. In the example of FIG. 4, the non-volatile memory 20 includes four planes PLN0, PLN1, PLN2, and PLN3. Note that the number of planes PLN is not limited to four. One plane PLN may be provided, or a plurality of planes PLN other than four planes may be provided. The planes PLN0 to PLN3 can operate independently of each other. In addition, the planes PLN0 to PLN3 can also operate in parallel.

Next, an internal configuration of the plane PLN will be described. Hereinafter, a case where the planes PLN0 to PLN3 have the same configuration will be described. Note that the configuration of each plane PLN may be different. Hereinafter, when any of the planes PLN0 to PLN3 is not limited, it is written as a "plane PLN". The plane PLN includes a memory cell array 211, a row decoder 212, a sense amplifier 213, a data register 214, and a column decoder 215.

The memory cell array 211 is a set of a plurality of arranged memory cell transistors. The memory cell array 211 includes a plurality of blocks BLK. In the example of FIG. 4, the memory cell array 211 includes four blocks BLK0, BLK1, BLK2, and BLK3. Note that the number of blocks BLK in the memory cell array 211 is arbitrary. The block BLK is, for example, a set of a plurality of memory cell transistors in which data is collectively erased. Details of the configuration of the block BLK will be described later.

The row decoder 212 is a decoding circuit of a row address RA. The row decoder 212 selects any block BLK in the memory cell array 211 based on a decoding result. The row decoder 212 applies voltages to interconnects (a word line and a selected gate line to be described later) in a row direction of the selected block BLK.

The sense amplifier 213 is a circuit that writes and reads the data DAT. The sense amplifier 213 is coupled to the memory cell array 211. The sense amplifier 213 reads the data DAT from the memory cell array 211 during the read operation. In addition, the sense amplifier 213 supplies voltages according to the write data DAT to the memory cell array 211 during the write operation. The sense amplifier 213 calculates the soft bit data SB based on the read data. In addition, the sense amplifier 213 calculates the compressed soft bit data SB from the plurality of pieces of soft bit data SB. In other words, the sequencer 206 is a control circuit that controls the sense amplifier 213 to calculate the compressed soft bit data SB.

The data register 214 is a register that temporarily stores the data DAT. The data register 214 is coupled to the sense amplifier 213. The data register 214 includes a plurality of latch circuits. Each latch circuit temporarily stores write data or read data.

The column decoder 215 is a circuit that decodes the column address CA. The column decoder 215 receives the column address CA from the address register 203. The column decoder 215 selects the latch circuits in the data register 214 based on a decoding result of the column address CA.

Note that some elements of the input/output circuit 201, the logic controller 202, the address register 203, the command register 204, the status register 205, the sequencer 206, the ready/busy circuit 207, the voltage generator 208, and the row decoder 212, the sense amplifier 213, the data register 214, and the column decoder 215 included in each of the plurality of planes PLN may be referred to as control circuits.

1.1.6 Circuit Configuration of Memory Cell Array

Next, an example of a circuit configuration of the memory cell array 211 will be described with reference to FIG. 5. FIG. 5 is a circuit diagram of the memory cell array 211. Note that the example of FIG. 5 illustrates a circuit configuration of one block BLK.

The block BLK includes, for example, four string units SU0 to SU3. Note that the number of string units SU included in the block BLK is arbitrary.

The string unit SU is, for example, a set of a plurality of NAND strings NS collectively selected in the write operation or the read operation. The string unit SU includes a plurality of NAND strings NS.

The NAND string NS is a set of a plurality of memory cell transistors MC coupled in series. The plurality of NAND strings NS in the string unit SU are coupled to any of bit lines BL0 to BLn (n is an integer of 1 or more). The NAND string NS includes a plurality of memory cell transistors MC and selection transistors ST1 and ST2. In the example of FIG. 5, the NAND string NS includes eight memory cell transistors MC0 to MC7.

The memory cell transistor MC is a memory element that stores data in a non-volatile manner. The memory cell transistor MC includes a control gate and a charge storage layer. The memory cell transistor MC may be a metal-oxide-nitride-oxide-silicon (MONOS) type or a floating gate (FG) type. In the MONOS type, an insulating layer is used as the charge storage layer. In the FG type, a conductive layer is used as the charge storage layer.

The selection transistors ST1 and ST2 are switching elements. The selection transistors ST1 and ST2 are used to select the string units SU during various operations, respectively.

The current paths of the selection transistor ST2, the memory cell transistors MC0 to MC7, and the selection transistor ST1 in the NAND string NS are coupled in series. A drain of the selection transistor ST1 is coupled to the bit line BL. A source of the selection transistor ST2 is coupled to a source line SL.

The control gates of the memory cell transistors MC0 to MC7 in the same block BLK are commonly coupled to the word lines WL0 to WL7, respectively. More specifically, for example, the block BLK includes four string units SU0 to SU3. Each string unit SU includes a plurality of memory cell transistors MC0. The control gates of the plurality of memory cell transistors MC0 in the block BLK are commonly coupled to one word line WL0. The same is applied to the memory cell transistors MC1 to MC7.

The gates of the plurality of selection transistors ST1 in the string unit SU are commonly coupled to one selected gate line SGD. More specifically, the gates of the plurality of selection transistors ST1 in the string unit SU0 are commonly coupled to a selected gate line SGD0. The gates of the plurality of selection transistors ST1 in the string unit SU1 are commonly coupled to a selected gate line SGD1. The gates of the plurality of selection transistors ST1 in the string unit SU2 are commonly coupled to a selected gate line SGD2. The gates of the plurality of selection transistors ST1 in the string unit SU3 are commonly coupled to a selected gate line SGD3.

The gates of the plurality of selection transistors ST2 in the block BLK are commonly coupled to a selected gate line SGS. Note that, similarly to the selected gate line SGD, a different selected gate line SGS may be provided for each string unit SU.

The word lines WL0 to WL7, the selected gate lines SGD0 to SGD3, and the selected gate line SGS are coupled to the row decoder 212 in the plane PLN, respectively.

The bit line BL is commonly coupled to one NAND string NS in each string unit SU of each block BLK. The same column address is assigned to the plurality of NAND strings NS coupled to one bit line BL. Each bit line BL is coupled to the sense amplifier 213 in the plane PLN.

The source line SL is shared among the plurality of blocks BLK, for example.

A set of the memory cell transistors MC coupled to the common word line WL in one string unit SU is written as, for example, a "cell unit CU". For example, when the memory cell transistor MC stores 1-bit data, the storage capacity of the cell unit CU is defined as "one-page data". The data length of one-page data can be an arbitrary bit length.

Note that the cell unit CU may have a storage capacity of two-page data or more based on the number of bits of data stored in the memory cell transistor MC. For example, when the memory cell transistor MC is a TLC, three-page data is stored in the cell unit CU. The data length of one-page data may be the same as the data length of the ECC frame, or one-page data may include a plurality of ECC frames.

1.1.7 Configuration of Data Register and Sense Amplifier

Next, an example of a configuration of the data register 214 and the sense amplifier 213 will be described with reference to FIG. 6. FIG. 6 is a block diagram of the data register 214 and the sense amplifier 213.

As illustrated in FIG. 6, the sense amplifier 213 includes a plurality of sense amplifier units SAU provided for each bit line BL. The data register 214 includes a plurality of latch circuits XDL provided for each sense amplifier unit SAU.

For example, the sense amplifier unit SAU includes a sense circuit SA, a calculation unit OP, and latch circuits SDL, ADL, BDL, CDL, and TDL. The sense circuit SA, the calculation unit OP, and the latch circuits SDL, ADL, BDL, CDL, and TDL are commonly coupled to the corresponding latch circuit XDL via a bus LBUS. In other words, the latch circuit XDL, the sense circuit SA, the calculation unit OP, and the latch circuits SDL, ADL, BDL, CDL, and TDL are coupled so as to be able to transmit and receive data to and from each other via the bus LBUS. Note that the number of latch circuits included in the sense amplifier unit SAU can be designed based on the number of bits of data that can be stored in one memory cell transistor MC.

The sense circuit SA senses the data read to the corresponding bit line BL during the read operation, and determines whether the read data is "0" or "1". The sense circuit SA applies a voltage to the bit line BL based on the write data during the write operation.

The calculation unit OP performs various logical calculations using data stored in the latch circuits XDL, SDL, ADL, BDL, CDL, and TDL. Note that the sense amplifier 213 may separately include a calculation circuit that performs various logical calculations instead of the calculation unit OP.

The latch circuits SDL, ADL, BDL, CDL, and TDL temporarily store read data or write data. For example, in the case of the read operation, the read data is stored in any one of the latch circuits SDL, ADL, BDL, CDL, and TDL. In addition, for example, in the case of the write operation, the write data of the latch circuit XDL is stored in any one of the latch circuits SDL, ADL, BDL, CDL, and TDL.

The latch circuit XDL is used as a cache memory for inputting and outputting data between the sense amplifier unit SAU and the input/output circuit 201. More specifically, the write data received from the memory controller 10 is transmitted to the latch circuits SDL, ADL, BDL, CDL, and TDL or the sense circuit SA via the latch circuit XDL. In addition, the read data stored in the latch circuits SDL, ADL, BDL, CDL, and TDL or the sense circuit SA is transmitted to the memory controller 10 via the latch circuit XDL.

1.2 Threshold Voltage Distribution of Memory Cell Transistor

Next, a threshold voltage distribution that can be obtained in the memory cell transistor MC will be described. Hereinafter, a case where the memory cell transistor MC is a TLC will be described, but the present embodiment can be applied as long as the memory cell transistor MC can store data of two bits or more.

Figure 7:
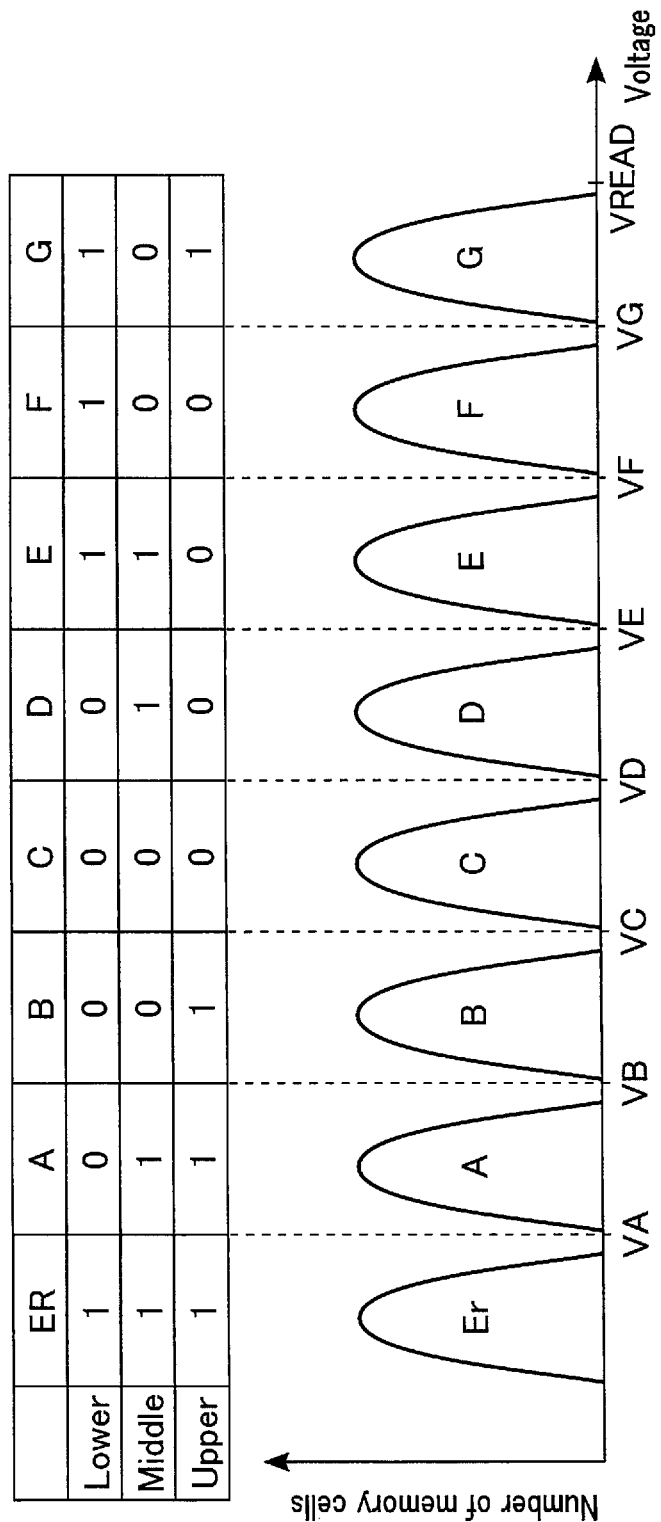
FIG. 7 is a diagram illustrating a relation between data allocation and a threshold voltage distribution of a triple level cell (TLC) included in the non-volatile memory according to the first embodiment.

1.2.1 Relation Between Threshold Voltage Distribution of Memory Cell Transistor and Data Allocation First, an example of the relation between the threshold voltage distribution of the memory cell transistor MC and the data allocation will be described with reference to FIG. 7. FIG. 7 is a diagram illustrating a relation between the threshold voltage distribution of the TLC and the data allocation.

As illustrated in FIG. 7, for example, the threshold voltage of each memory cell transistor MC takes a value included in any of eight discrete distributions. Hereinafter, the eight distributions are written as an "Er" state, an "A" state, a "B" state, a "C" state, a "D" state, an "E" state, an "F" state, and a "G" state in ascending order of the threshold voltage.

The "Er" state corresponds to, for example, a data erase state. In addition, the "A" to "G" states correspond to a state in which charges are injected into the charge storage layer and data is written. In the write operation, verify voltages corresponding to the threshold voltage distributions are set to VA to VG. In this case, these voltage values are in a relation of VA<VB<VC<VD<VE<VF<VG<VREAD. The voltage VREAD is a voltage applied to the word line WL coupled to the cell unit CU not to be read during the read operation. When the voltage VREAD is applied to the gate of the memory cell transistor MC, the memory cell transistor MC is turned on regardless of held data.

Note that, in the write operation, the verify voltages corresponding to the threshold voltage distributions are set to VA to VG, but the method for determining the voltages VA to VG is not limited thereto. For example, the voltages VA to VG are written to a ROM fuse of the non-volatile memory 20 (these are written as default voltages). After shipment of the memory system 3, the CPU 12 may read the voltages VA to VG from the ROM fuse. In addition, the CPU 12 may update the voltages VA to VG read from the ROM fuse of the non-volatile memory 20 and store the updated voltages in any block BLK of the non-volatile memory 20. In addition, the CPU 12 can update the voltages VA to VG along with the execution of the shift read operation or the tracking operation. For example, the CPU 12 executes the shift read operation or the tracking operation in the patrol read operation.

The shift read operation means that the CPU 12 shifts the read voltage and attempts to read data from the non-volatile memory 20 again. At this time, the CPU 12 may update the voltages VA to VG by storing information of the shift amount from the default voltage.

In the tracking operation, in a case where the adjacent threshold voltage distributions overlap each other, the CPU 12 obtains an intersection of the threshold voltage distributions, and calculates an appropriate read voltage, that is, a shift amount from the obtained intersection. Alternatively, the tracking operation is processing of searching for a voltage at which the number of fail bits in the ECC circuit 16 is minimized or a voltage at which the ECC circuit 16 can perform error correction when the read voltage is changed instead of the intersection.

The relation between each state and the voltages VA to VG describes in detail. The threshold voltage included in the "Er" state is lower than the voltage VA. The threshold voltage included in the "A" state is equal to or higher than the voltage VA and lower than the voltage VB. The threshold voltage included in the "B" state is equal to or higher than the voltage VB and lower than the voltage VC. The threshold voltage included in the "C" state is equal to or higher than the voltage VC and lower than the voltage VD. The threshold voltage included in the "D" state is equal to or higher than the voltage VD and lower than the voltage VE. The threshold voltage included in the "E" state is equal to or higher than the voltage VE and lower than the voltage VF. The threshold voltage included in the "F" state is equal to or higher than the voltage VF and lower than the voltage VG. The threshold voltage included in the "G" state is equal to or higher than the voltage VG and lower than the voltage VREAD.

As described above, each memory cell transistor MC has any one of the eight threshold voltage distributions, so that it can take eight types of states. By assigning these states to "000" to "111" in binary notation, each memory cell transistor MC can hold 3-bit data. Hereinafter, the 3-bit data is written as a lower bit, a middle bit, and an upper bit, respectively. Further, a set of lower bits collectively written (or read) to the cell unit CU is written as a lower page. A set of middle bits is written as a middle page. A set of upper bits is written as an upper page. Note that when any of the lower page, the middle page, and the upper page is not limited, it is simply written as a "page".

For example, in the case of the read operation of the lower page, data read by the read voltage VA is stored in, for example, the latch circuit TDL. Subsequently, data read by the read voltage VE is logically calculated with the data in the latch circuit TDL in the calculation unit OP, and the result is stored in the latch circuit TDL. The stored data is transmitted to the memory controller 10 via the latch circuit XDL as read data of the lower page.

In the case of the read operation of the middle page, data read by the read voltage VB is stored in, for example, the latch circuit TDL. Subsequently, data read by the read voltage VD is logically calculated with the data in the latch circuit TDL in the calculation unit OP, and the result is stored in the latch circuit TDL. Further, data read by the read voltage VF is logically calculated with the data in the latch circuit TDL in the calculation unit OP, and the result is stored in the latch circuit TDL. The stored data is transmitted to the memory controller 10 via the latch circuit XDL as read data of the middle page.

In the case of the read operation of the upper page, data read by the read voltage VC is stored in, for example, the latch circuit. TDL. Subsequently, data read by the read voltage VG is logically calculated with the data in the latch circuit TDL in the calculation unit OP, and the result is stored in the latch circuit TDL. The stored data is transmitted to the memory controller 10 via the latch circuit XDL as read data of the upper page.

In the example of FIG. 7, data is allocated to the memory cell transistors MC included in each threshold voltage distribution in "upper bit/middle bit/lower bit" as follows.

"Er" state: "111" data
"A" state: "110" data
"B" state: "100" data
"C" state: "000" data
"D" state: "010" data
"E" state: "011" data
"F" state: "001" data
"G" state: "101" data In a case where the data allocated as described above is read, the lower bit is determined by the read operation corresponding to the "A" state and the "E" state. The middle bit is determined by the read operation corresponding to the "B" state, the "D" state, and the "F" state. The upper bit is determined by the read operation corresponding to the "C" state and the "G" state. That is, the values of the lower bit, the middle bit, and the upper bit are determined by read operations corresponding to two states, three states, and two states, respectively. Hereinafter, such data allocation is written as "2-3-2 code". Note that the data allocation to the "Er" to "G" states is not limited to the 2-3-2 code.

1.2.2 Specific Examples of Hard Bit Data and Soft Bit Data

Figure 8:
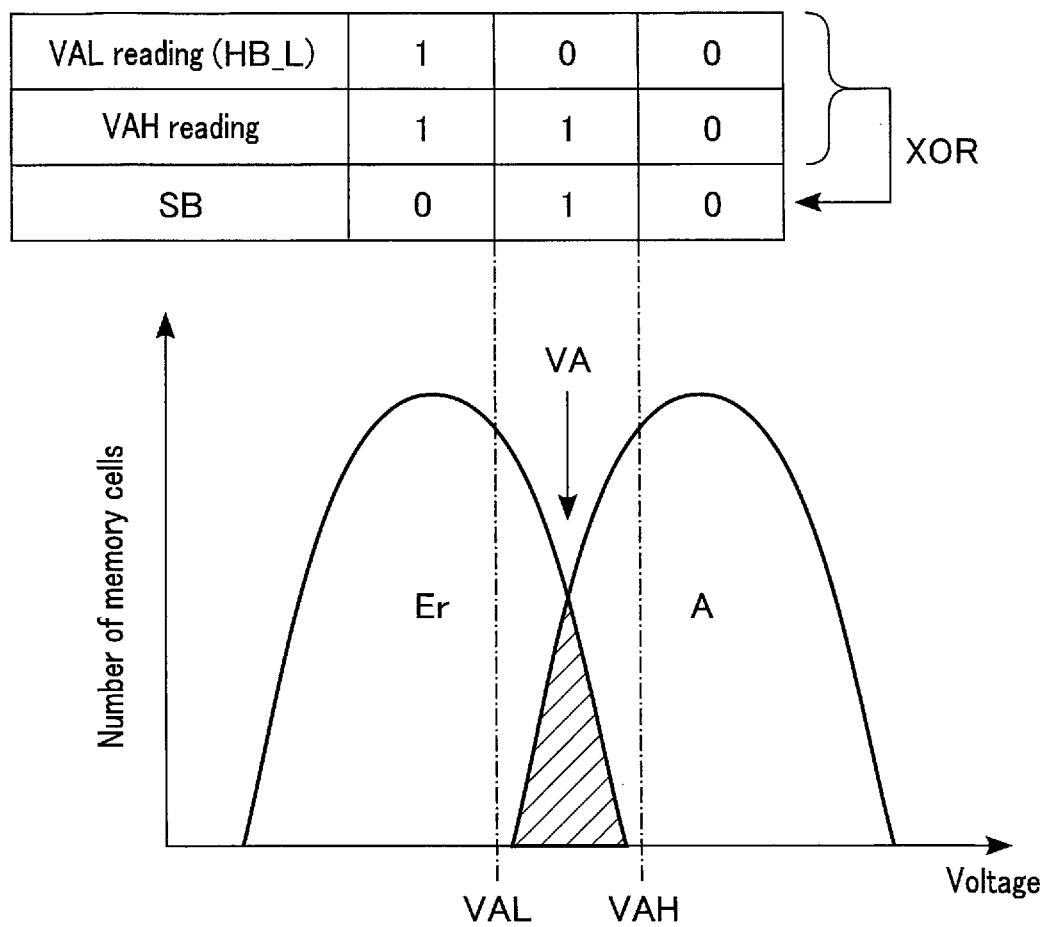
FIG. 8 is a diagram illustrating an example of a relation between threshold voltage distributions of an "Er" state and an "A" state and hard bit data and soft bit data in the memory system according to the first embodiment.

Next, specific examples of the hard bit data HB and the soft bit data SB will be described with reference to FIG. 8. FIG. 8 is a diagram illustrating an example of a relation between the threshold voltage distributions of the "Er" state and the "A" state and the hard bit data HE and the soft bit data SB.

As illustrated in FIG. 8, due to an influence of read disturbance, data retention, or the like, the width of the threshold voltage distribution of each state may be expanded, and parts of the skirt shapes may overlap each other between the adjacent threshold voltage distributions (shaded region in FIG. 8). In such a case, when the read operation is executed, the memory cell transistor MC corresponding to the overlapping region of the skirt shapes is likely to be a fail bit. More specifically, for example, when the read operation corresponding to the "A" state is executed with the voltage VA, the memory cell transistor MC of the "Er" state having a threshold voltage equal to or higher than the voltage VA and the memory cell transistor MC of the "A" state having a threshold voltage lower than the voltage VA become fail bits. If the number of generated fail bits exceeds the number of error correctable bits of the ECC circuit 16, it is difficult to correctly read data.

Therefore, in the present embodiment, in the read operation (a first read operation) of one state, two read voltages sandwiching the overlapping region of the skirt shapes of the threshold voltage distributions are set. More specifically, the two read voltages VAL and VAH are set for the "A" state. The voltage VAL is a voltage lower than the voltage VA. The voltage VAH is a voltage higher than the voltage VA. A region where the "Er" state and the "A" state overlap is located between the voltage VAL and the voltage VAH. Note that the magnitude of the voltage difference between the voltage VAL and the voltage VA may be the same as or different from the magnitude of the voltage difference between the voltage VA and the voltage VAH.

For example, in the read operation (a second read operation) using the voltage VAL (a first voltage), data of the memory cell transistor MC whose threshold voltage is lower than the voltage VAL is "1". Data of the memory cell transistor MC whose threshold voltage is equal to or higher than the voltage VAL is "0".

In addition, in the read operation (a third read operation) using the voltage VAH (a second voltage), data of the memory cell transistor MC whose threshold voltage is lower than the voltage VAH is "1". Data of the memory cell transistor MC whose threshold voltage is equal to or higher than the voltage VAH is "0".

In the present embodiment, in the two read voltages corresponding to one state, read data based on the lower read voltage is defined as the hard bit data HB.

The soft bit data SB is calculated by an exclusive OR (XOR) calculation of the two read data. In the example of FIG. 8, the soft bit data SB of the memory cell transistor MC whose threshold voltage is lower than the voltage VAL is "0". The soft bit data SB of the memory cell transistor MC whose threshold voltage is equal to or higher than the voltage VAL and lower than the voltage VAH is "1". The soft bit data SB of the memory cell transistor MC whose threshold voltage is equal to or higher than the voltage VAH is "0". Note that the calculation of the soft bit data SB is not limited to the XOR calculation. The calculation of the soft bit data SB can be set based on the definition of the soft bit data SB.

For example, in a case where the soft bit data SB of the memory cell transistor MC whose threshold voltage is equal to or higher than the voltage VAL and lower than the voltage VAH is defined as "0", an exclusive NOR (XNOR) calculation may be used for the calculation of the soft bit data SB.

Therefore, the soft bit data SB indicates whether or not the threshold voltage is located near the boundary between the two adjacent threshold voltage distributions. By referring to the hard bit data HB and the soft bit data SB, information on whether or not the threshold voltage is located at the skirt shape of the threshold voltage distribution of the target state can be acquired.

1.2.3 Hard Bit and Compressed Soft Bit of Each State

Figure 9:
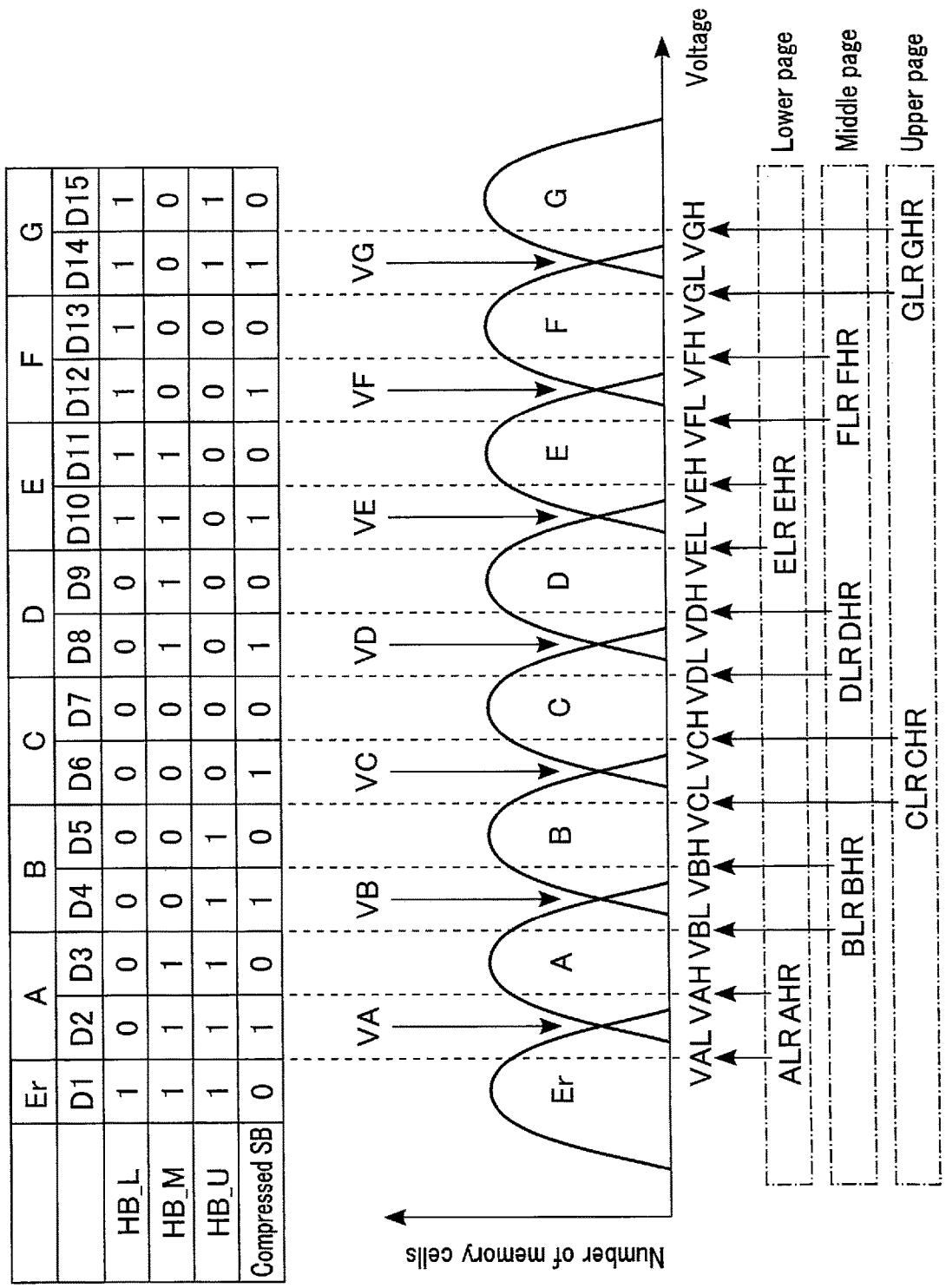
FIG. 9 is a diagram illustrating a relation between a threshold voltage distribution of a TLC and hard bit data and compressed soft bit data in the memory system according to the first embodiment.

Next, the hard bit data HB and the compressed soft bit data SB of each state will be described with reference to FIG. 9. FIG. 9 is a diagram illustrating a relation between the threshold voltage distribution of the TLC and the hard bit data HB and the compressed soft bit data SB.

As illustrated in FIG. 9, two read voltages corresponding to the "A" state are set to a voltage VAL and a voltage VAH. Two read voltages corresponding to the "B" state are set to a voltage VBL and a voltage VBH. Two read voltages corresponding to the "C" state are set to a voltage VCL and a voltage VCH. Two read voltages corresponding to the "D" state are set to a voltage VDL and a voltage VDH. Two read voltages corresponding to the "E" state are set to a voltage VEL and a voltage VEH. Two read voltages corresponding to the "F" state are set to a voltage VFL and a voltage VFH. Two read voltages corresponding to the "G" state are set to a voltage VGL and a voltage VGH. These voltages are in a relation of VAL<VA<VAR<VBL<VB<VBH<VCL<VC<VCH<VDL<VD<VDH<VEL<VE<VEH<VFL<VF<VFH<VGL<VG<VGH<VREAD.

The read operation using the voltage VAL is written as an ALR read. The read operation using the voltage VAH is written as an AHR read. The read operation using the voltage VBL is written as a BLR read. The read operation using the voltage VBH is written as a BHR read. The read operation using the voltage VCL is written as a CLR read. The read operation using the voltage VCH is written as a CHR read. The read operation using the voltage VDL is written as a DLR read. The read operation using the voltage VDH is written as a DHR read. The read operation using the voltage VEL is written as an ELR read. The read operation using the voltage VEH is written as an EHR read. The read operation using the voltage VFL is written as an FLR read. The read operation using the voltage VFH is written as an FHR read. The read operation using the voltage VGL is written as a GLR read. The read operation using the voltage VGH is written as a GHR read.

In the read operation of the lower page, four read operations of the ALR read, the AHR read, the ELR read, and the EHR read are executed. The hard bit data HB_L is data determined by the ALR read and the ELR read. The soft bit data SB_L is based on the hard bit data HB_L and data determined by the AHR read and the EHR read.

For example, in the case of the read operation of the hard bit data of the lower page, the data read by the read voltage VAL is stored in, for example, the latch circuit TDL. Subsequently, the data read by the read voltage VEL is logically calculated with the data in the latch circuit TDL in the calculation unit OP, and the result is stored in the latch circuit TDL as the hard bit data HB_L.

In addition, for example, in the case of the read operation of the soft bit data of the lower page, the data read by the read voltage VAH is stored in, for example, the latch circuit CDL. Subsequently, the data read by the read voltage VEH is logically calculated with the data in the latch circuit CDL in the calculation unit OP, and the result is stored in the latch circuit CDL. Thereafter, the calculation unit OP performs an XOR calculation on the data stored in the latch circuit TDL and the data stored in the latch circuit CDL, and stores the calculated result in, for example, the latch circuit CDL as soft bit data SB_L.

In the read operation of the middle page, six read operations of the BLR read, the BHR read, the DLR read, the DHR read, the FLR read, and the FHR read are executed. The hard bit data HB_M is data determined by the BLR read, the DLR read, and the FLR read. The soft bit data SB_M is based on the hard bit data HB_M and data determined by the BHR read, the DHR read, and the FHR read.

For example, in the case of the read operation of the hard bit data of the middle page, the data read by the read voltage VBL is stored in, for example, the latch circuit TDL. Subsequently, the data read by the read voltage VDL is logically calculated with the data in the latch circuit TDL in the calculation unit OP, and the result is stored in the latch circuit TDL. Further, the data read by the read voltage VFL is logically calculated with the data in the latch circuit TDL in the calculation unit OP, and the result is stored in the latch circuit TDL as the hard bit data HB_M.

In addition, for example, in the case of the read operation of the soft bit data of the middle page, the data read by the read voltage VBH is stored in, for example, the latch circuit BDL. Subsequently, the data read by the read voltage VDH is logically calculated with the data in the latch circuit BDL in the calculation unit OP, and the result is stored in the latch circuit BDL. Further, the data read by the read voltage VFH is logically calculated with the data in the latch circuit BDL in the calculation unit OP, and the result is stored in the latch circuit BDL. Thereafter, the calculation unit OP performs an XOR calculation on the hard bit data HB_M stored in the latch circuit TDL and the data stored in the latch circuit BDL, and stores the calculated result in, for example, the latch circuit BDL as the soft bit data SB_M.

In the read operation of the upper page, four read operations of the CLR read, the CHR read, the GLR read, and the GHR read are executed. The hard bit data HB_U is data determined by the CLR read and the GLR read. The soft bit data SB_U is based on the hard bit data HB_U and data determined by the CHR read and the GHR read.

For example, in the case of the read operation of the hard bit data of the upper page, the data read by the read voltage VCL is stored in, for example, the latch circuit TDL. Subsequently, the data read by the read voltage VGL is logically calculated with the data in the latch circuit TDL in the calculation unit OP, and the result is stored in the latch circuit TDL as the hard bit data HB_U.

In addition, for example, in the case of the read operation of the soft bit data of the upper page, the data read by the read voltage VCH is stored in, for example, the latch circuit ADL. Subsequently, the data read by the read voltage VGH is logically calculated with the data in the latch circuit ADL in the calculation unit OP, and the result is stored in the latch circuit ADL. Thereafter, the calculation unit OP performs an XOR calculation on the data stored in the latch circuit TDL and the data stored in the latch circuit ADL, and stores the calculated result in, for example, the latch circuit ADL as the soft bit data SB_U.

The compressed soft bit data SB is data calculated from the soft bit data SB_L, SB_M, and SB_U.

In the example of FIG. 9, the threshold voltages of the memory cell transistors MC are divided into 15 sections to correspond to the 14 read voltages. More specifically, a threshold voltage of a section D1 is lower than the voltage VAL. A threshold voltage of a section D2 is equal to or higher than the voltage VAL and lower than the voltage VAH. A threshold voltage of a section D3 is equal to or higher than the voltage VAH and lower than the voltage VBL. A threshold voltage of a section D4 is equal to or higher than the voltage VBL and lower than the voltage VBH. A threshold voltage of a section D5 is equal to or higher than the voltage VBH and lower than the voltage VCL. A threshold voltage of a section D6 is equal to or higher than the voltage VCL and lower than the voltage VCH. A threshold voltage of a section D7 is equal to or higher than the voltage VCH and lower than the voltage VDL. A threshold voltage of a section D8 is equal to or higher than the voltage VDL and lower than the voltage VDH. A threshold voltage of a section D9 is equal to or higher than the voltage VDH and lower than the voltage VEL. A threshold voltage of a section D10 is equal to or higher than the voltage VEL and lower than the voltage VEH. A threshold voltage of a section D11 is equal to or higher than the voltage VEH and lower than the voltage VFL. A threshold voltage of a section D12 is equal to or higher than the voltage VFL and lower than the voltage VFH. A threshold voltage of a section D13 is equal to or higher than the voltage VFH and lower than the voltage VGL. A threshold voltage of a section D14 is equal to or higher than the voltage VGL and lower than the voltage VGH. A threshold voltage of a section D15 is equal to or higher than the voltage VGH and lower than the voltage VREAD.

A combination of "hard bit data HB_U/HM M/HB_L" and "compressed soft bit data SB" in each section is as follows.

Section D1 ("Er" state): "111", "0"
Section D2 ("A" state): "110", "1"
Section D3 ("A" state): "110", "0"
Section D4 ("B" state): "100", "1"
Section D5 ("B" state): "100", "0"
Section D6 ("C" state): "000", "1"
Section D7 ("C" state): "000", "0"
Section D8 ("D" state): "010", "1"
Section D9 ("D" state): "010", "0"
Section D10 ("E." state): "011", "1"
Section D11 ("E" state): "011", "0"
Section D12 ("F" state): "001", "1"
Section D13 ("F" state): "001", "0"
Section D14 ("G" state): "101", "1"
Section D15 ("G" state): "101", "0"

1.3 Method for Compressing Soft Bit Data

Figure 10:
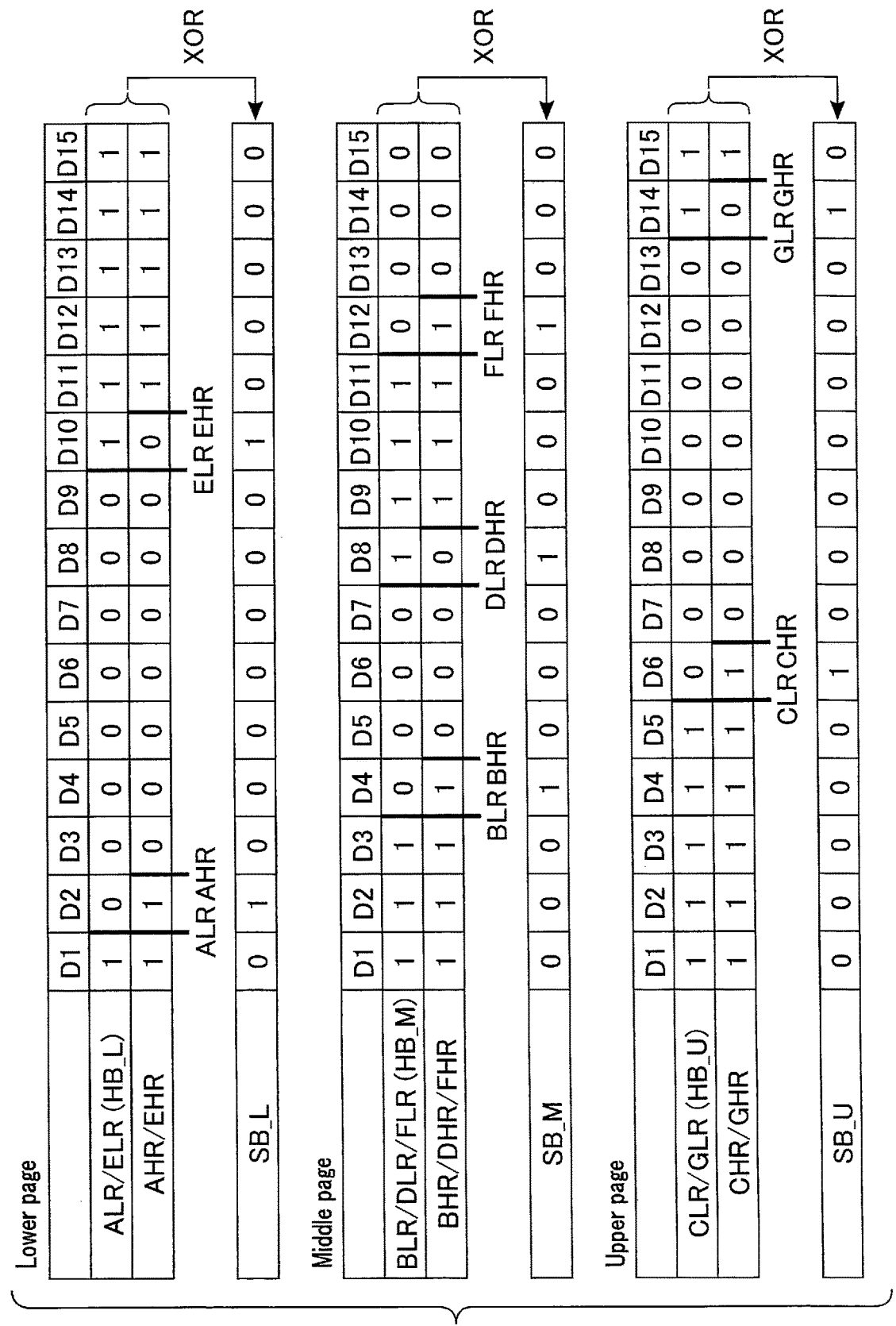
FIG. 10 is a diagram illustrating calculation processing of calculating soft bit data SB_L, SB_M, and SB_U from results of read operations of a lower page, a middle page, and an upper page in the memory system according to the first embodiment.
Figure 11:
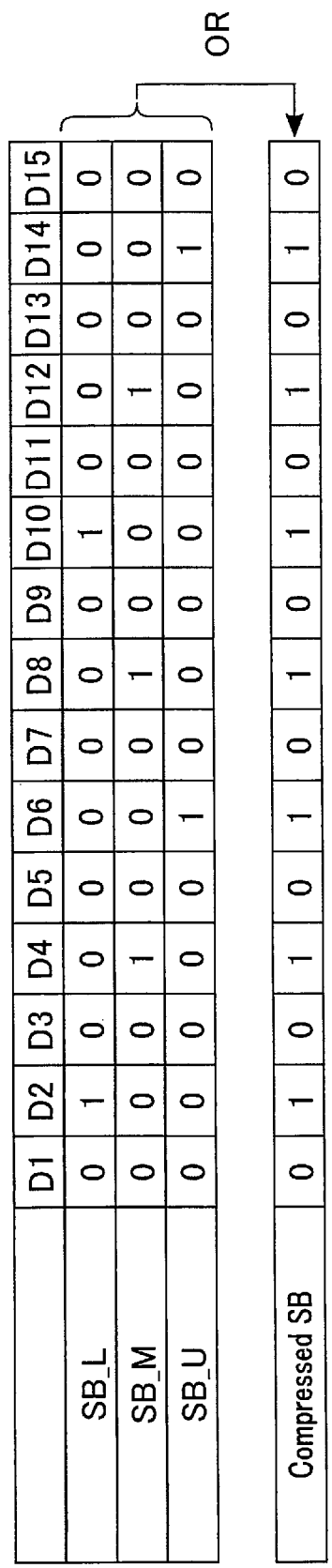
FIG. 11 is a diagram illustrating calculation processing of calculating compressed soft bit data from soft bit data SB_L, SB_M, and SB_U in the memory system according to the first embodiment.

Next, an example of a method for compressing the soft bit data SB will be described with reference to FIGS. 10 and 11. FIG. 10 is a diagram illustrating calculation processing of calculating the soft bit data SB_L, SB_M, and SB_U from the results of the read operations of the lower page, the middle page, and the upper page. FIG. 11 is a diagram illustrating calculation processing for calculating the compressed soft bit data SB from the soft bit data SB_L, SB_M, and SB_U.

As illustrated in FIG. 10, for example, after the read operation of the lower page, the sense amplifier 213 performs an XOR calculation of the hard bit data HB_L (ALR/ELR) determined by the ALR read and the ELR read and the data (AHR/EHR) determined by the AHR read and the EHR read. As a result, the soft bit data SB_L is calculated. In this case, the sections D2 and D10 of the soft bit data SB_L are "1" data, and the other sections D are "0" data.

Next, after the read operation of the middle page, the sense amplifier 213 performs an XOR calculation of the hard bit data HB_M (BLR/DLR/FLR) determined by the BLR read, the DLR read, and the FLR read and the data (BHR/DHR/FHR) determined by the BHR read, the DHR read, and the FHR read. As a result, the soft bit data SB_M is calculated. In this case, the sections D4, D8, and D12 of the soft bit data SB_M are "1" data, and the other sections D are "0" data.

Next, after the read operation of the upper page, the sense amplifier 213 performs an XOR calculation of the hard bit data HB_U (CLR/GLR) determined by the CLR read and the GLR read and the data (CHR/GHR) determined by the CHR read and the GHR read. As a result, the soft bit data SB_U is calculated. The sections D6 and D14 of the soft bit data SB_U are "1" data, and the other sections D are "0" data.

As illustrated in FIG. 11, in the "1" data of the soft bit data SB_L, SB_M, and SB_U, threshold voltage distributions (states) to be targets of the "1" data are different from each other. Therefore, the sections D in which "1" data of the soft bit data SB_L, SB_M, and SB_U exist are different from each other. Therefore, the sense amplifier 213 executes an OR (logical sum) calculation of the soft bit data SB_L, SB_M, and SB_U. As a result, the compressed soft bit data SB is calculated. That is, the three-page data is compressed into one-page data by the OR calculation. Therefore, a data size of the hard bit data HB_L, a data size of the hard bit data HB_M, a data size of the hard bit data HB_U, a data size of the soft bit data SB_L, a data size of the soft bit data SB_M, a data size of the soft bit data SB_U, and a data size of the compressed soft bit data SB are the same size.

For example, in a case where the soft bit data SB_U is stored in the latch circuit ADL, the soft bit data SB_M is stored in the latch circuit BDL, and the soft bit data SB_L is stored in the latch circuit CDL, the calculation unit OP performs an OR calculation of the data stored in the latch circuit ADL, the data stored in the latch circuit BDL, and the data stored in the latch circuit CDL, and stores the calculated result in, for example, the latch circuit ADL as the compressed soft bit data SB. The stored data is transmitted as compressed soft bit data SB to the memory controller 10 via the latch circuit XDL.

1.4 Method for Restoring Compressed Soft Bit

Next, an example of a method for restoring the compressed soft bit data SB will be described with reference to FIG. 12. FIG. 12 is a diagram illustrating restoration processing of the soft bit data SB_L, SB_M, and SB_U.

Positions (states) at which "1" data of the soft bit data SB_L, SB_M, and SB_U can be generated are mutually exclusive. In addition, a combination of the hard bit data HB_L, HB_M, and HB_U and a combination of the soft bit data SB_L, SB_M, and SB_U can be defined on a one-to-one basis. By using these, the soft bit data SB of each page is restored from the hard bit data HB_L, HB_M, and HB_U and the compressed soft bit data SB.

As illustrated in FIG. 12, the SB restoration circuit 163 receives the hard bit data HB_L, HB_M, and HB_U and the compressed soft bit data SB from the non-volatile memory 20. The SB decoder 1006 executes the following calculation to restore the soft bit data SB_L, SB_M, and SB_U. Note that, in the following arithmetic expression. "|" indicates an OR calculation, and "~" indicates inverted data. In addition, in the following arithmetic expression, the hard bit data HB_L, HB_M, and HB_U are simply written as "L", "M", and "U", respectively.

$$SB\_L = ((\sim L \& M \& U) | (L \& M \& \sim U)) \& SB$$

$$SB\_M = ((\sim L \& \sim M \& U) | (\sim L \& M \& \sim U) | (L \& \sim M \& \sim U)) \& SB$$

$$SB\_U = ((\sim L \& \sim M \& \sim U) | (L \& \sim M \& U)) \& SB$$

The soft bit data SB_L, SB_M, and SB_U described using FIG. 10 are restored by the above arithmetic expression. Note that the arithmetic expression can be appropriately changed based on data allocation in the memory cell transistor MC.

1.5 Read Operation

1.5.1 Flow of Read Operation

Figure 13:
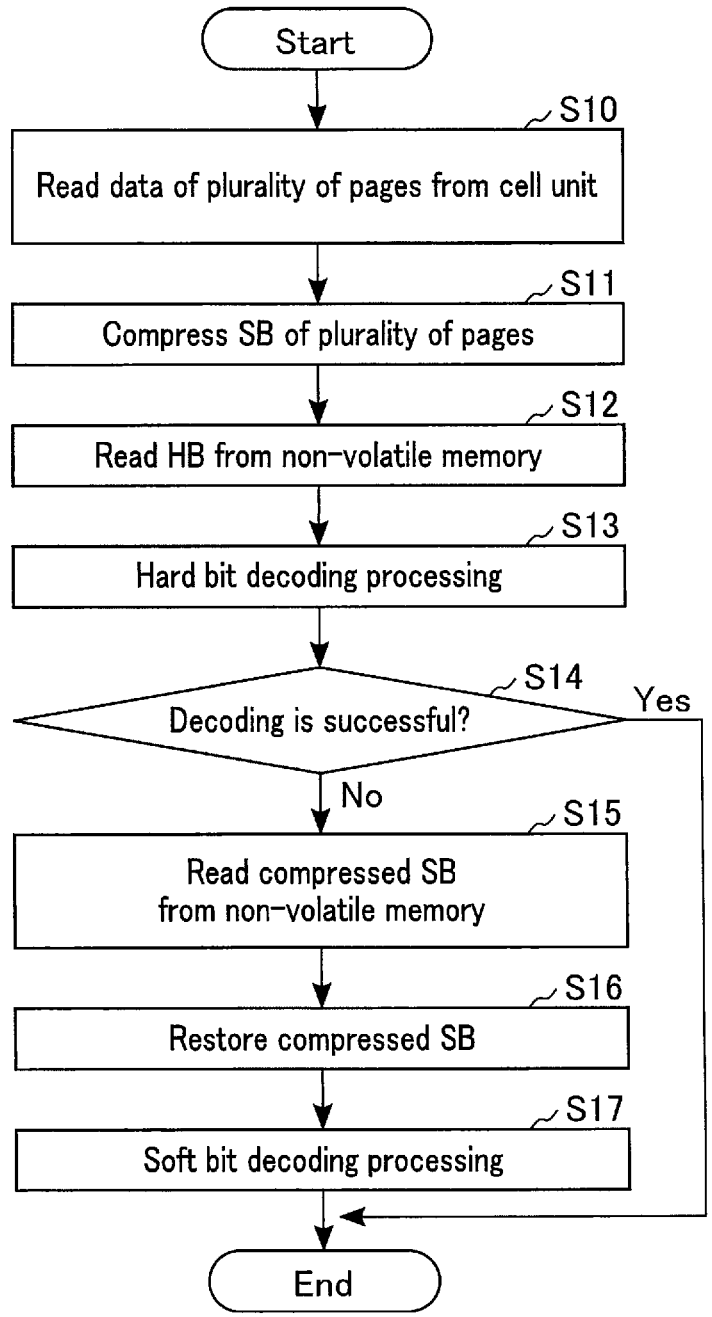
FIG. 13 is a flowchart of a read operation in the memory system according to the first embodiment.

First, a flow of a read operation in the memory system 3 will be described with reference to FIG. 13. FIG. 13 is a flowchart of the read operation. Note that the example of FIG. 13 illustrates a case where data of a plurality of pages is read from one cell unit CU.

As illustrated in FIG. 13, when the memory controller 10 receives a read request from the host device 2, the memory controller 10 starts the read operation. The non-volatile memory 20 executes a read operation of data of a plurality of pages stored in the cell unit CU based on the control of the memory controller 10 (step S10). For example, when the memory cell transistor MC is the TLC, the read operation of the lower page, the read operation of the middle page, and the read operation of the upper page are executed.

The sense amplifier 213 compresses the soft bit data SB of a plurality of pages to calculate the compressed soft bit data SB (step S11). More specifically, the sense amplifier 213 compresses (performs an OR calculation of) the soft bit data SB_L, SB_M, and SB_U to calculate the compressed soft bit data SB.

The memory controller 10 reads the hard bit data HB of a plurality of pages from the non-volatile memory 20 (step S12). More specifically, for example, the memory controller 10 reads the hard bit data HB_L, HB_M, and HB_U from the non-volatile memory 20. Note that steps S11 and S12 may be executed at least partially in parallel, or step S12 may be started first.

The hard bit decoding circuit 161 executes hard bit decoding processing (step S13). More specifically, for example, the hard bit decoding circuit 161 uses the hard bit data HB_L, HB_M, and HB_U to execute hard bit decoding processing on the lower page, the middle page, and the upper page, respectively.

When the hard bit decoding processing is successful (step S14 Yes), the memory controller 10 transmits the decoded user data to the host device 2, and the read operation ends.

When the hard bit decoding processing fails (step S14 No), the memory controller 10 reads the compressed soft bit data SB from the non-volatile memory 20 (step S15). Note that the soft bit data SB_L, SB_M, and SB_U are not read.

The SB restoration circuit 163 restores the soft bit data SB of each page from the compressed soft bit data SB (step S16). More specifically, for example, the SB restoration circuit 163 restores the soft bit data SB_L, SB_M, and SB_U from the compressed soft bit data SB using the hard bit data HB_L, HB_M, and HB_U.

The soft bit decoding circuit 162 executes soft bit decoding processing (step S17). More specifically, the soft bit decoding circuit 162 executes soft bit decoding processing of the lower page data, the middle page data, and the upper page data using the hard bit data HB_L, HB_M, and HB_U, the soft bit data SB_L, SB_M, and SB_U, and the LLR table.

1.5.2 Read Operation in Non-Volatile Memory

Next, a read operation in the non-volatile memory 20 will be described. The read operation in the non-volatile memory 20 roughly includes a cell read operation and a cache read operation. The cell read operation is an operation of reading data from the memory cell array 211 to the data register 214, that is, the latch circuit XDL, and the cache read operation is an operation of reading (externally outputting) data from the data register 214 to the memory controller 10 via the input/output circuit 201.

For example, the non-volatile memory 20 has at least one of a first read mode, a second read mode, and a third read mode in the read operation. The non-volatile memory 20 executes any read mode based on a command sequence received from the memory controller 10.

The first read mode and the second read mode are operation modes in which a command set is transmitted for each page and page data is read. The first read mode is an operation mode in which a page data read operation (a cell read operation and a cache read operation) is sequentially executed. In the case of the first read mode, while the cell read operation is being executed, the ready/busy signal RBn is set to the "L" level. Therefore, the cell read operation and the cache read operation cannot be executed in parallel.

The second read mode is an operation mode in which the cell read operation and the cache read operation of another page can be executed in parallel. In the case of the second read mode, if the cache read operation can be executed even when the cell read operation is executed, that is, if the data output of the latch circuit XDL can be performed, the ready/busy signal RBn is set to the "H" level.

The third read mode is an operation mode in which data of a plurality of pages stored in the cell unit CU is continuously read based on one command set.

1.5.3 Command Sequence of First Read Mode

Figure 14:
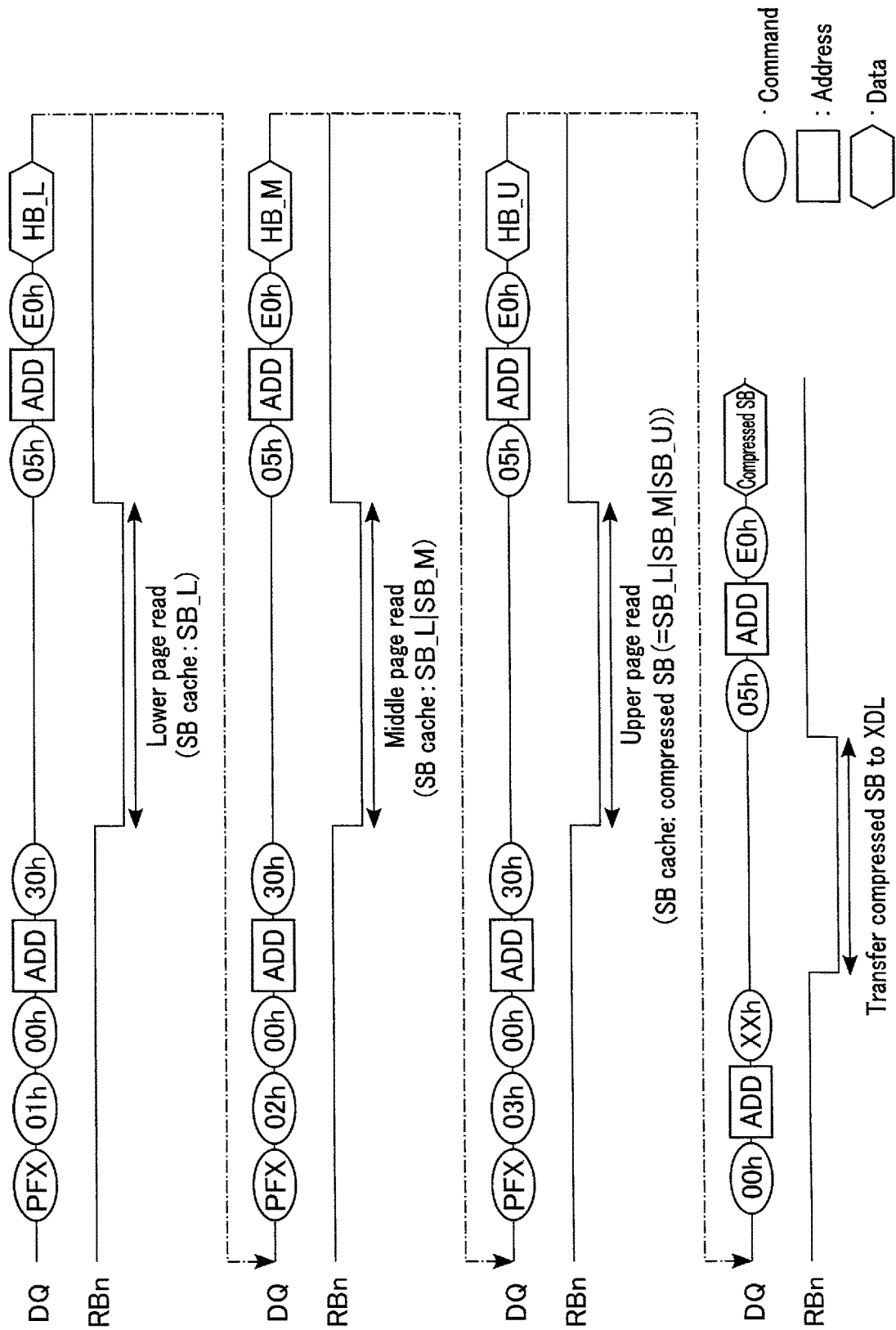
FIG. 14 is a command sequence of a first read mode in the memory system according to the first embodiment.

Next, an example of a command sequence of the first read mode will be described with reference to FIG. 14. FIG. 14 is a command sequence of the first read mode. In the example of FIG. 14, in order to simplify the description, the signals CEn, CLE, ALE, WEn, REn, DQS, and DQSn are omitted, and the signal DQ and the ready/busy signal RBn are illustrated. In the signal DQ, a command is written in a round frame, an address is written in a rectangular frame, and data is written in a hexagonal frame.

The example of FIG. 14 illustrates a case where the read operation of the lower page, the read operation of the middle page, and the read operation of the upper page of one cell unit CU are sequentially executed.

As illustrated in FIG. 14, first, the memory controller 10 transmits a command set of the cell read operation of the lower page to the non-volatile memory 20. More specifically, first, the memory controller 10 transmits a command "PFX" to the non-volatile memory 20. The command "PFX" is a prefix command indicating execution of the read operation of the hard bit data HB and the calculation operation of the soft bit data SB. In other words, the command "PFX" is a command indicating execution of two read operations using two read voltages and execution of calculation of the soft bit data SB with respect to one state. Next, the memory controller 10 continuously transmits commands "01h" and "00h", an address "ADD", and a command "30h" to the non-volatile memory 20. The command "01h" is a command designating the lower page. The command "00h" is a command indicating execution of the cell read operation. The address "ADD" corresponds to the cell unit CU to be subjected to the read operation. For example, the address "ADD" includes a row address RA, a column address CA, and the like. The command "30h" is a command for executing the cell read operation based on the previously transmitted address "ADD".

When the non-volatile memory 20 receives the command "30h", the non-volatile memory 20 sets the ready/busy signal RBn to the "L" level and starts the cell read operation of the lower page. As a result of the cell read operation, for example, the hard bit data HB_L is stored in the latch circuit XDL. For example, the soft bit data SB_L is stored in the latch circuit ADL as cache data (SB cache in FIG. 14) of the soft bit data SB.

When the cell read operation of the lower page ends, the non-volatile memory 20 sets the ready/busy signal RBn to the "H" level.

When the memory controller 10 confirms the ready/busy signal RBn at the "H" level, the memory controller 10 transmits a command set of the cache read operation of the lower page (hard bit data HB_L) to the non-volatile memory 20. More specifically, the memory controller 10 continuously transmits a command "05h", an address "ADD", and a command "E0h" to the non-volatile memory 20. The command "05h" is a command indicating execution of the cache read operation. The command "E0h" is a command for executing the cache read operation based on the previously transmitted address "ADD".

The non-volatile memory 20 transmits the hard bit data HB_L of the data register 214 to the memory controller 10.

After reading the hard bit data HB_L from the non-volatile memory 20, that is, after the cache read operation ends, the memory controller 10 transmits the command set of the cell read operation of the middle page to the non-volatile memory 20. More specifically, the memory controller 10 continuously transmits commands "PFX", "02h", and "00h", an address "ADD", and a command "30h" to the non-volatile memory 20. The command "02h" is a command designating the middle page.

When the non-volatile memory 20 receives the command "30h", the non-volatile memory 20 sets the ready/busy signal RBn to the "L" level and starts the cell read operation of the middle page. As a result of the cell read operation, for example, the hard bit data HB_M is stored in the latch circuit XDL. The soft bit data SB_M is subjected to an OR calculation with the soft bit data SB_L stored in the latch circuit ADL, for example. For example, an OR calculation result (SB_L|SB_M in FIG. 14) of the soft bit data SB_L and SB_M is stored in the latch circuit ADL as the SB cache.

When the cell read operation of the middle page ends, the non-volatile memory 20 sets the ready/busy signal RBn to the "H" level.

When the memory controller 10 confirms the ready/busy signal RBn at the "H" level, the memory controller 10 transmits the command set of the cache read operation of the middle page (hard bit data HB_M) to the non-volatile memory 20. More specifically, the memory controller 10 continuously transmits a command "05h", an address "ADD", and a command "E0h" to the non-volatile memory 20.

The non-volatile memory 20 transmits the hard bit data HB_M of the data register 214 to the memory controller 10.

After reading the hard bit data HB_M from the non-volatile memory 20, the memory controller 10 transmits a command set of the cell read operation of the upper page to the non-volatile memory 20. More specifically, the memory controller 10 continuously transmits commands "PFX", "03h", and "ooh", an address "ADD", and a command "30h" to the non-volatile memory 20. The command "03h" is a command designating the upper page.

When the non-volatile memory 20 receives the command "30h", the non-volatile memory 20 sets the ready/busy signal RBn to the "L" level and starts the cell read operation of the upper page. As a result of the cell read operation, for example, the hard bit data HB_U is stored in the latch circuit XDL. The soft bit data SB_H is subjected to an OR calculation with the SB cache (SB_L|SB_M) stored in the latch circuit ADL, for example. For example, an OR calculation result (SB_L|SB_M|SB_U in FIG. 14) of the soft bit data SB_L, SB_M, and SB_U is stored in the latch circuit ADL as the SB cache. That is, the compressed soft bit data SB is stored in the latch circuit ADL.

When the cell read operation of the upper page ends, the non-volatile memory 20 sets the ready/busy signal RBn to the "H" level.

When the memory controller 10 confirms the ready/busy signal RBn at the "H" level, the memory controller 10 transmits a command set of the cache read operation of the upper page (hard bit data HB_U) to the non-volatile memory 20. More specifically, the memory controller 10 continuously transmits a command "05h", an address "ADD", and a command "E0h" to the non-volatile memory 20.

The non-volatile memory 20 transmits the hard bit data HB_U of the data register 214 to the memory controller 10.

After reading the hard bit data HB_U from the non-volatile memory 20, the memory controller 10 transmits, to the non-volatile memory 20, a command set for reading (transferring) the compressed soft bit data SB to the latch circuit XDL. More specifically, the memory controller 10 continuously transmits a command "ooh", an address "ADD", and a command "XXh" to the non-volatile memory 20. The command "XXh" is a command for transferring the compressed soft bit data SB to the latch circuit XDL.

When the non-volatile memory 20 receives the command "XXh", the non-volatile memory 20 sets the ready/busy signal RBn to the "L" level and transfers the compressed soft bit data SB from the latch circuit ADL to the latch circuit XDL, for example.

When the transfer of the compressed soft bit data SB ends, the non-volatile memory 20 sets the ready/busy signal RBn to the "H" level.

When the memory controller 10 confirms the ready/busy signal RBn at the "H" level, the memory controller 10 transmits a command set of the cache read operation of the compressed soft bit data SB to the non-volatile memory 20. More specifically, the memory controller 10 continuously transmits a command "05h", an address "ADD", and a command "E0h" to the non-volatile memory 20.

The non-volatile memory 20 transmits the compressed soft bit data SB of the data register 214 to the memory controller 10.

1.5.4 Command Sequence of Second Read Mode

Next, an example of a command sequence of the second read mode will be described with reference to FIG. 15. FIG. 15 is a command sequence of the second read mode. In the example of FIG. 15, in order to simplify the description, the signals CEn, CLE, ALE, WEn, REn, DQS, and DQSn are omitted, and the signal DQ and the ready/busy signal RBn are illustrated. In the signal DQ, a command is written in a round frame, an address is written in a rectangular frame, and data is written in a hexagonal frame.

The example of FIG. 15 illustrates a case where the read operation of the lower page, the read operation of the middle page, and the read operation of the upper page of one cell unit CU are sequentially executed.

As illustrated in FIG. 15, first, the memory controller 10 transmits a command set of the cell read operation of the lower page to the non-volatile memory 20. More specifically, the memory controller 10 continuously transmits commands "PFX", "01h", and "00h", an address "ADD", and a command "30h" to the non-volatile memory 20.

When the non-volatile memory 20 receives the command "30h", the non-volatile memory 20 sets the ready/busy signal RBn to the "L" level and starts the cell read operation of the lower page. As a result of the cell read operation, for example, the hard bit data HB_L is stored in the latch circuit XDL. For example, the soft bit data SB_L is stored in the latch circuit ADL.

When the cell read operation of the lower page ends, the non-volatile memory 20 sets the ready/busy signal RBn to the "H" level.

When the memory controller 10 confirms the ready/busy signal RBn at the "H" level, the memory controller 10 transmits a command set for reserving the cell read operation of the middle page to the non-volatile memory 20. More specifically, the memory controller 10 continuously transmits commands "PFX", "02h", and "ooh", an address "ADD", and a command "31h" to the non-volatile memory 20. The command "31h" is a command for reserving the execution of the cell read operation of the command set including the command "31h" after the end of the cell read operation that is being executed.

When the non-volatile memory 20 receives the command "31h", the non-volatile memory 20 sets the ready/busy signal RBn to the "L" level and reserves the cell read operation of the middle page.

When the reservation ends, the non-volatile memory 20 sets the ready/busy signal RBn to the "H" level. Since the cell read operation of the lower page ends, the non-volatile memory 20 starts the cell read operation of the middle page while keeping the ready/busy signal RBn at the "H" level.

When the memory controller 10 confirms the ready/busy signal RBn at the "H" level, the memory controller 10 transmits a command set of the cache read operation of the lower page (hard bit data HB_L) to the non-volatile memory 20. More specifically, the memory controller 10 continuously transmits a command "05h", an address "ADD", and a command "E0h" to the non-volatile memory 20.

The non-volatile memory 20 transmits the hard bit data HB_L of the data register 214 to the memory controller 10 in parallel with the cell read operation of the middle page.

After reading the hard bit data HB_L from the non-volatile memory 20, the memory controller 10 transmits a command set for reserving the cell read operation of the upper page to the non-volatile memory 20. More specifically, the memory controller 10 continuously transmits commands "PFX", "03h", and "ooh", an address "ADD", and a command "31h" to the non-volatile memory 20.

When the reservation of the cell read operation of the upper page ends and the cell read operation of the middle page does not end, the non-volatile memory 20 sets the ready/busy signal RBn to the "L" level. For example, after the output of the hard bit data HB_L, the hard bit data HB_M is stored in the latch circuit XDL. An OR calculation result (SB_L|SB_M) of the soft bit data SB_L and SB_M is stored in the latch circuit ADL as an SB cache.

When the cell read operation of the middle page ends, the non-volatile memory 20 sets the ready/busy signal RBn to the "H" level. Since the cell read operation of the middle page ends, the non-volatile memory 20 starts the cell read operation of the upper page while keeping the ready/busy signal RBn at the "H" level.

When the memory controller 10 confirms the ready/busy signal RBn at the "H" level, the memory controller 10 transmits the command set of the cache read operation of the middle page (hard bit data HB_M) to the non-volatile memory 20. More specifically, the memory controller 10 continuously transmits a command "05h", an address "ADD", and a command "E0h" to the non-volatile memory 20.

The non-volatile memory 20 transmits the hard bit data HB_M of the data register 214 to the memory controller 10 in parallel with the cell read operation of the upper page.

When the cache read operation of the middle page (hard bit data HBM) ends, the memory controller 10 transmits a command "3Fh" to the non-volatile memory 20. The command "3Fh" is a command for reserving the transfer of the read data to the latch circuit XDL after the end of the cell read operation of the last page (in the example of FIG. 15, the upper page).

When the output of the hard bit data HB_M (cache read operation) ends and the data transfer to the latch circuit XDL is possible, the non-volatile memory 20 sets the ready/busy signal RBn to the "L" level. Then, the non-volatile memory 20 transfers the hard bit data HB_U to the latch circuit XDL. At this time, for example, an OR calculation result (SB_L|SB_M|SB_U) of the soft bit data SB_L, SB_M, and SB_U is stored in the latch circuit ADL as the SB cache. That is, the compressed soft bit data SB is stored in the latch circuit ADL.

When the transfer of the hard bit data HB_U to the latch circuit XDL ends, the non-volatile memory 20 sets the ready/busy signal RBn to the "H" level.

When the memory controller 10 confirms the ready/busy signal RBn at the "H" level, the memory controller 10 transmits a command set of the cache read operation of the upper page (hard bit data HB_U) to the non-volatile memory 20. More specifically, the memory controller 10 continuously transmits a command "05h", an address "ADD", and a command "E0h" to the non-volatile memory 20.

The non-volatile memory 20 transmits the hard bit data HB_U of the data register 214 to the memory controller 10.

The read operation of the compressed soft bit data SB is similar to that in the first operation mode.

1.5.5 Command Sequence of Third Read Mode

Figure 16:
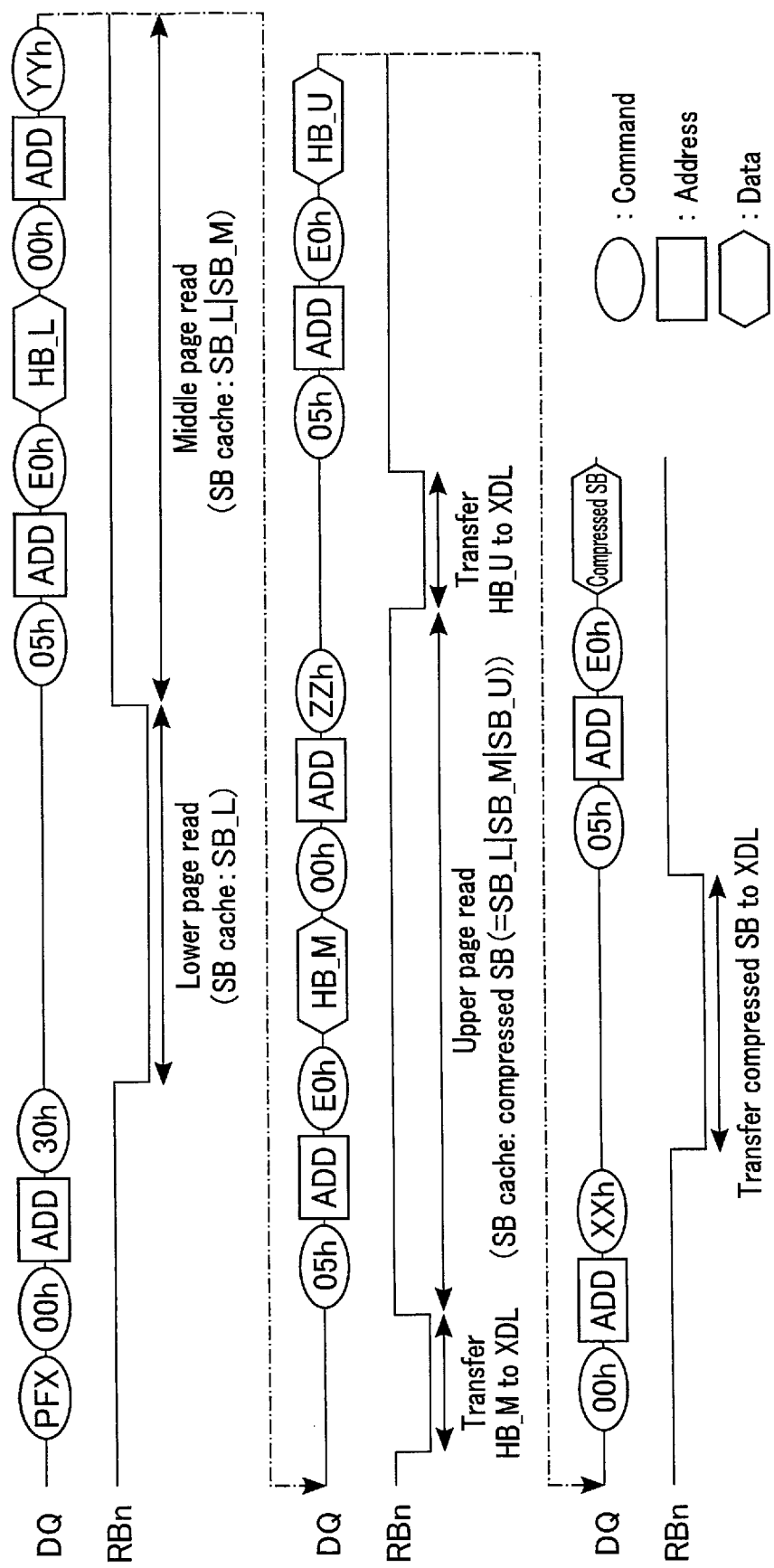
FIG. 16 is a command sequence of a third read mode in the memory system according to the first embodiment.

Next, an example of a command sequence of the third read mode will be described with reference to FIG. 16. FIG. 16 is a command sequence of the third read mode. In the example of FIG. 16, in order to simplify the description, the signals CEn, CLE, ALE, WEn, REn, DQS, and DQSn are omitted, and the signal DQ and the ready/busy signal RBn are illustrated. In the signal DQ, a command is written in a round frame, an address is written in a rectangular frame, and data is written in a hexagonal frame.

The example of FIG. 16 illustrates a case where the read operation of the lower page, the read operation of the middle page, and the read operation of the upper page of one cell unit CU are continuously executed based on one command set.

As illustrated in FIG. 16, first, the memory controller 10 transmits a command set of the read operation in the third read mode to the non-volatile memory 20. More specifically, the memory controller 10 continuously transmits commands "PFX" and "00h", an address "ADD", and a command "30h" to the non-volatile memory 20.

When the non-volatile memory 20 receives the command "30h", the non-volatile memory 20 sets the ready/busy signal REn to the "L" level and first starts the cell read operation of the lower page. As a result of the cell read operation, for example, the hard bit data HE L is stored in the latch circuit XDL. For example, the soft bit data SB_L is stored in the latch circuit ADL.

When the cell read operation of the lower page ends, the non-volatile memory 20 sets the ready/busy signal RBn to the "H" level. In addition, the non-volatile memory 20 starts the cell read operation of the middle page while keeping the ready/busy signal RBn at the "H" level.

When the memory controller 10 confirms the ready/busy signal RBn at the "H" level, the memory controller 10 transmits a command set of the cache read operation of the lower page (hard bit data HB_L) to the non-volatile memory 20. More specifically, the memory controller 10 continuously transmits a command "05h", an address "ADD", and a command "E0h" to the non-volatile memory 20.

The non-volatile memory 20 transmits the hard bit data HB_L of the data register 214 to the memory controller 10 in parallel with the cell read operation of the middle page.

After reading the hard bit data HB_L from the non-volatile memory 20, the memory controller 10 transmits, to the non-volatile memory 20, a command set for reading (transferring) the hard bit data HB_M to the latch circuit XDL. More specifically, the memory controller 10 continuously transmits a command "00h", an address "ADD", and a command "YYh" to the non-volatile memory 20. The command "YYh" is a command for transferring the hard bit data HB_M to the latch circuit XDL.

When the cell read operation of the middle page ends and the data transfer to the latch circuit XDL is possible, the non-volatile memory 20 sets the ready/busy signal RBn to the "L" level. Then, the non-volatile memory 20 transfers the hard bit data HB_M to the latch circuit XDL. At this time, for example, an OR calculation result (SB_L|SB_M) of the soft bit data SB_L and SB_M is stored in the latch circuit ADL as the SB cache.

When the transfer of the hard bit data HB_M to the latch circuit XDL ends, the non-volatile memory 20 sets the ready/busy signal RBn to the "H" level. The non-volatile memory 20 starts the cell read operation of the upper page while keeping the ready/busy signal RBn at the "H" level.

When the memory controller 10 confirms the ready/busy signal RBn at the "H" level, the memory controller 10 transmits the command set of the cache read operation of the middle page (hard bit data HB_M) to the non-volatile memory 20. More specifically, the memory controller 10 continuously transmits a command "05h", an address "ADD", and a command "E0h" to the non-volatile memory 20.

The non-volatile memory 20 transmits the hard bit data HB_M of the data register 214 to the memory controller 10 in parallel with the cell read operation of the upper page.

After reading the hard bit data HB_M from the non-volatile memory 20, the memory controller 10 transmits, to the non-volatile memory 20, a command set for reading (transferring) the hard bit data HB_U to the latch circuit XDL. More specifically, the memory controller 10 continuously transmits a command "ooh", an address "ADD", and a command "ZZh" to the non-volatile memory 20. The command "ZZh" is a command for transferring the hard bit data HB_U to the latch circuit XDL.

When the cell read operation of the upper page ends and the data transfer to the latch circuit XDL is possible, the non-volatile memory 20 sets the ready/busy signal RBn to the "L" level. Then, the non-volatile memory 20 transfers the hard bit data HB_U to the latch circuit XDL. At this time, for example, an OR calculation result (SB_L|SB_M|SB_U) of the soft bit data SB_L, SB_M, and SB_U is stored in the latch circuit ADL as the SB cache. That is, the compressed soft bit data SB is stored in the latch circuit ADL.

When the transfer of the hard bit data HB_U to the latch circuit XDL ends, the non-volatile memory 20 sets the ready/busy signal RBn to the "H" level.

When the memory controller 10 confirms the ready/busy signal RBn at the "H" level, the memory controller 10 transmits a command set of the cache read operation of the upper page (hard bit data HB_U) to the non-volatile memory 20. More specifically, the memory controller 10 continuously transmits a command "05h", an address "ADD", and a command "E0h" to the non-volatile memory 20.

The non-volatile memory 20 transmits the hard bit data HB_U of the data register 214 to the memory controller 10.

The read operation of the compressed soft bit data SB is similar to that in the first operation mode.

1.6 Effects According to Present Embodiment

With the configuration according to the present embodiment, it is possible to provide a memory system capable of suppressing an increase in the data transfer amount. The effects will be described in detail.

For example, when soft bit decoding processing is executed, at least one piece of soft bit data is required for one page. Therefore, soft bit data of a plurality of pages is read from the non-volatile memory to the memory controller according to the number of pages of the cell unit CU. For example, in the case of the TLC, at least a total of six pages of page data including three pages of hard bit data and three pages of soft bit data corresponding to the lower page, the middle page, and the upper page is read. Therefore, when the multi-value of the memory cell transistor progresses, the amount of data transfer from the non-volatile memory to the memory controller increases. For this reason, the data transfer time increases, and the processing capacity of the memory system decreases.

On the other hand, with the configuration according to the present embodiment, the non-volatile memory 20 can compress (logical sum calculation) the soft bit data SB of a plurality of pages of the cell unit CU to calculate the compressed soft bit data SB of one page data. For this reason, an increase in the data transfer amount can be suppressed. Therefore, the data transfer time can be shortened, and the processing capability of the memory system 3 can be improved.

Furthermore, with the configuration according to the present embodiment, the memory controller 10 can restore the soft bit data SB corresponding to each page from the hard bit data HB and the compressed soft bit data SB.

2. Second Embodiment

Next, a second embodiment will be described. In the second embodiment, a flow of a read operation different from that of the first embodiment will be described. Hereinafter, differences from the first embodiment will be mainly described.

2.1 Flow of Read Operation

Figure 17:
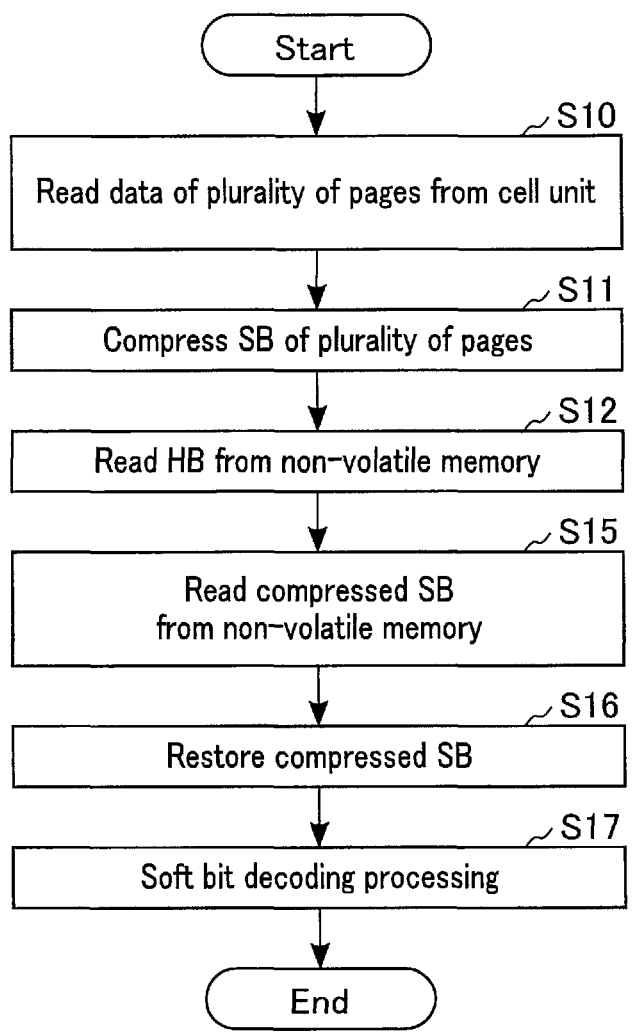
FIG. 17 is a flowchart of a read operation in a memory system according to a second embodiment.

First, a flow of a read operation in a memory system 3 will be described with reference to FIG. 17. FIG. 17 is a flowchart of the read operation. Note that the example of FIG. 17 illustrates a case where data of a plurality of pages is read from one cell unit CU.

As illustrated in FIG. 17, unlike FIG. 13 of the first embodiment, steps (steps S13 and S14) of hard bit decoding processing are omitted. A memory controller 10 reads a plurality of pieces of hard bit data HB from a non-volatile memory 20 (step S12), and then, reads compressed soft bit data SB (step S15). Subsequent steps (steps S16 and S17) are similar to those in the first embodiment.

2.2 Effects According to Present Embodiment

With the configuration according to the present embodiment, effects similar to those of the first embodiment can be obtained.

3. Third Embodiment

Next, a third embodiment will be described. In the third embodiment, a read operation different from those of the first embodiment and the second embodiment will be described. Hereinafter, differences from the first embodiment and the second embodiment will be mainly described.

3.1 Configurations of Data Register and Sense Amplifier

First, an example of configurations of a data register 214 and a sense amplifier 213 will be described with reference to FIG. 18. FIG. 18 is a block diagram of the data register 214 and the sense amplifier 213.

As illustrated in FIG. 18, the sense amplifier 213 of the present embodiment includes a counter CT. The other configuration is similar to that in FIG. 6 of the first embodiment.

The counter CT is a counter that counts the number of pieces of "1" data (the number of bits) in one-page data of compressed soft bit data SB. The counter CT transfers a count result to a sequencer 206. For example, the sequencer 206 transfers the count result as status information STS to a status register 205. Note that the data for which the counter CT counts the number of pieces of "1" data is not limited to the compressed soft bit data SB. For example, the counter CT may count the number of pieces of "1" data of each of soft bit data SB_L, SB_M, and SB_U. In addition, the counter CT may count the number of pieces of "0" data. The counter CT counts the number of pieces (the number of bits) of data of any logic level in a latch circuit to be counted.

Figure 19:
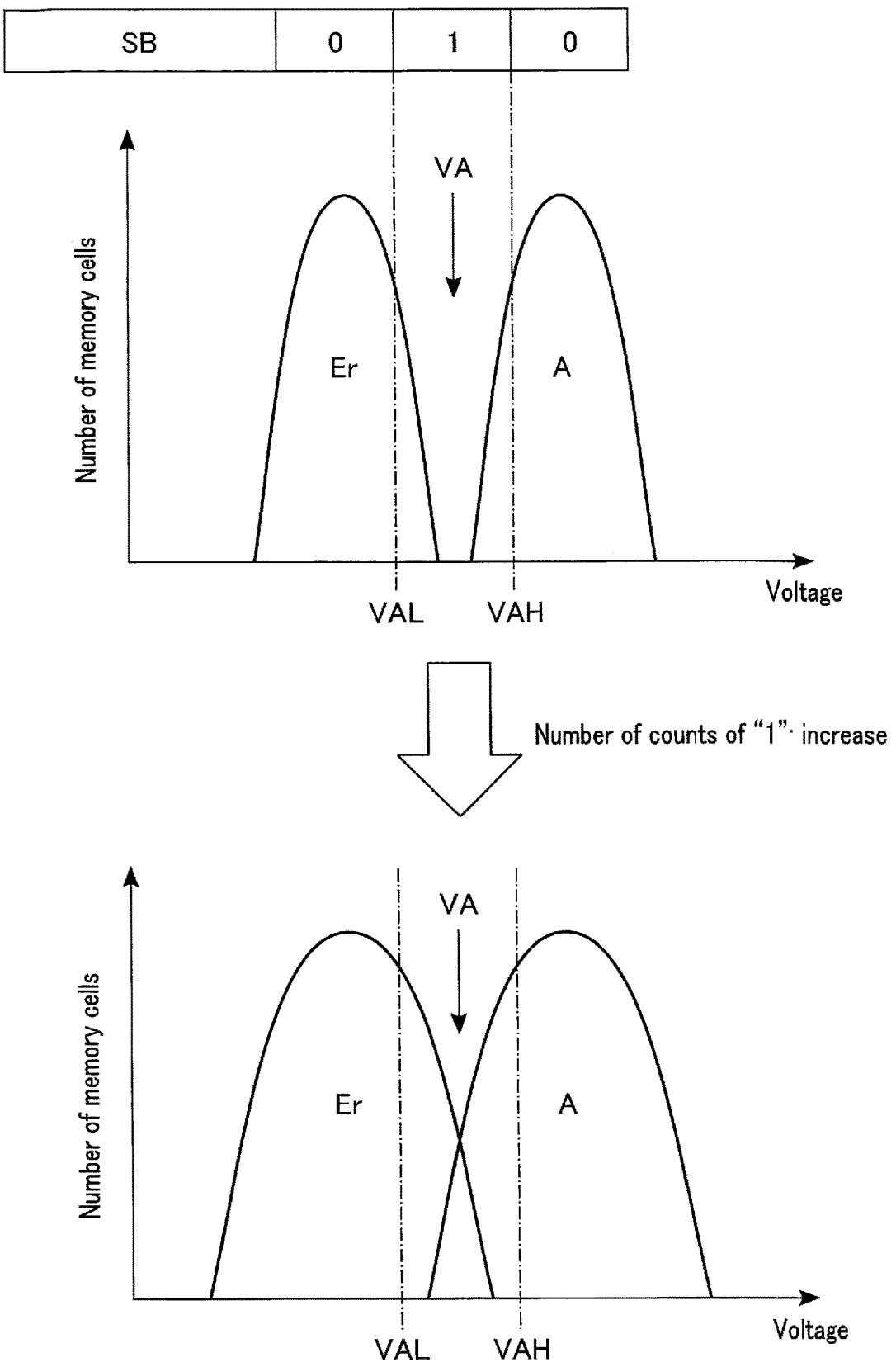
FIG. 19 is a diagram illustrating a relation between threshold voltage distributions of an "Er" state and an "A" state and the number of counts in a memory system according to the third embodiment.

3.2 Specific Example of Relation Between Number of Counts and Threshold Voltage Distribution Next, a specific example of a relation between the number of counts by the counter CT and a threshold voltage distribution will be described with reference to FIG. 19. FIG. 19 is a diagram illustrating a relation between threshold voltage distributions of an "Er" state and an "A" state and the number of counts.

As illustrated in FIG. 19, for example, when the threshold voltage distribution of the "Er" state and the threshold voltage distribution of the "A" state do not overlap, the number of memory cell transistors MC in which a threshold voltage is between a voltage VAL and a voltage VAH is relatively small. In other words, the number of memory cell transistors MC in which soft bit data SB indicates "1" data is relatively small. In such a case, the number of counts of "1" data by the counter CT is relatively small. On the other hand, when an overlapping region of skirt shapes of the threshold voltage distributions increases, the number of memory cell transistors MC in which the threshold voltage is between the voltage VAL and the voltage VAH increases. In other words, the number of memory cell transistors MC in which the soft bit data SB indicates "1" data increases. When the overlapping region of the skirt shapes of the threshold voltage distributions increases, the number of fail bits increases, and the possibility that hard bit decoding processing fails increases. Therefore, a difficulty level of the hard bit decoding processing can be estimated by the number of counts of "1" data of the compressed soft bit data SB.

3.3 Flow of Read Operation

Figure 20:
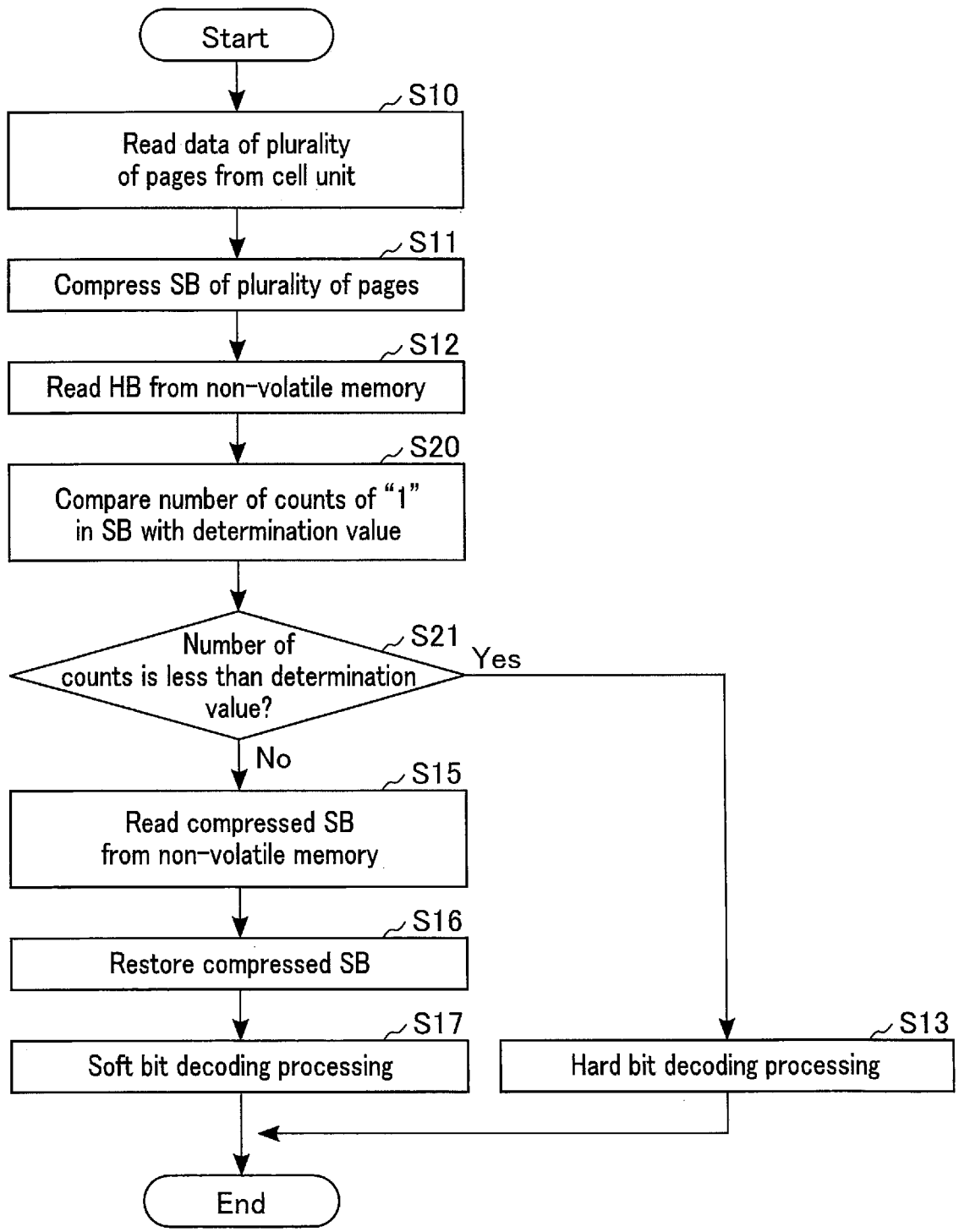
FIG. 20 is a flowchart of a read operation in the memory system according to the third embodiment.

Next, a flow of a read operation in a memory system 3 will be described with reference to FIG. 20. FIG. 20 is a flowchart of the read operation. Note that the example of FIG. 20 illustrates a case where data of a plurality of pages is read from one cell unit CU.

As illustrated in FIG. 20, processes from steps S10 to S12 are similar to those in the first embodiment.

After step S12, a memory controller 10 reads the number of counts of "1" data of the compressed soft bit data SB from a non-volatile memory 20. Then, the memory controller 10 compares the number of counts with a preset determination value (step S20). Note that the non-volatile memory 20 may compare the number of counts with the determination value. In this case, the memory controller 10 reads a comparison result from the non-volatile memory 20. Further, the non-volatile memory 20 may count the number of pieces of "1" data in each of the soft bit data SB_L, SB_M, and SB_U. In this case, the memory controller 10 may compare each number of counts with the determination value.

When the number of counts is less than the determination value (step S21_Yes), the memory controller 10 executes hard bit decoding processing (step S13). In this case, since there is a high possibility that the hard bit decoding processing will succeed, the memory controller 10 executes the hard bit decoding processing as it is without executing the reading of the compressed soft bit data SB.

When the number of counts is equal to or larger than the determination value (step S21 No), the memory controller 10 executes the operations of steps S15 to S17, similarly to the first embodiment.

3.4 Command Sequence of Read Operation

Figure 21:
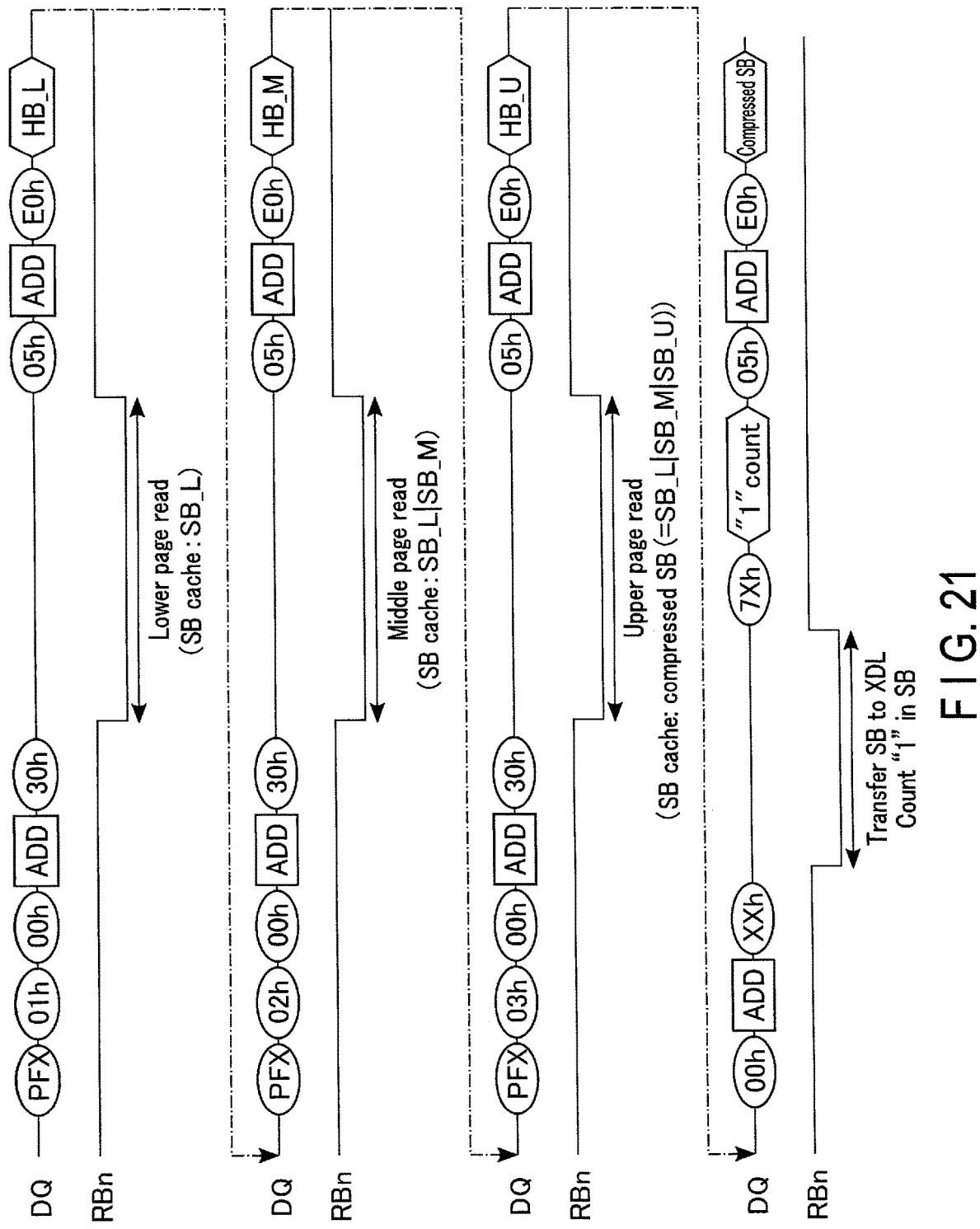
FIG. 21 is a command sequence of a read operation in the memory system according to the third embodiment.

Next, an example of a command sequence of the read operation will be described with reference to FIG. 21. FIG. 21 is a command sequence of the read operation. In the example of FIG. 21, in order to simplify the description, signals CEn, CLE, ALE, WEn, REn, DQS, and DQSn are omitted, and a signal DQ and a ready/busy signal RBn are illustrated. In the signal DQ, a command is written in a round frame, an address is written in a rectangular frame, and data is written in a hexagonal frame.

Although the example of FIG. 21 illustrates a case where a first read mode is executed, the present embodiment can also be applied to a second read mode or a third read mode.

As illustrated in FIG. 21, a command set up to a cache read operation of hard bit data HB_U is similar to that in FIG. 14 of the first embodiment.

After reading the hard bit data HB_U from the non-volatile memory 20, the memory controller 10 transmits, to the non-volatile memory 20, a command set for reading (transferring) the compressed soft bit data SB to the latch circuit XDL. More specifically, the memory controller 10 continuously transmits a command "00h", an address "ADD", and a command "XXh" to the non-volatile memory 20.

When the non-volatile memory 20 receives the command "XXh", the non-volatile memory 20 sets the ready/busy signal RBn to the "L" level and transfers the compressed soft bit data SB from the latch circuit ADL to the latch circuit XDL, for example. At this time, the counter CT counts the number of pieces of "1" data of the compressed soft bit data SB. The number of counts is stored in the status register 205.

When the transfer of the compressed soft bit data SB and the counting of the number of pieces of "1" data end, the non-volatile memory 20 sets the ready/busy signal RBn to the "H" level.

When the memory controller 10 confirms the ready/busy signal RBn at the "H" level, the memory controller 10 transmits a command set for reading the number of counts. The memory controller 10 reads information of the number of counts as the status information STS from the status register 205. More specifically, the memory controller 10 transmits a command "7Xh" to the non-volatile memory 20. The command "7Xh" is a command for executing the reading of the status information STS.

When the non-volatile memory 20 receives the command "7Xh", the non-volatile memory 20 transmits information ("1" count in FIG. 21) of the number of counts as the status information STS to the memory controller 10.

After receiving the information of the number of counts, the memory controller 10 transmits a command set of the cache read operation of the compressed soft bit data SB to the non-volatile memory 20. More specifically, the memory controller 10 continuously transmits a command "05h", an address "ADD", and a command "E0h" to the non-volatile memory 20.

The non-volatile memory 20 transmits the compressed soft bit data SB of the data register 214 to the memory controller 10.

3.5 Effects According to Present Embodiment

With the configuration according to the present embodiment, effects similar to those of the first embodiment can be obtained.

Further, with the configuration according to the present embodiment, the non-volatile memory 20 includes the counter CT that counts the number of pieces of "1" data of the compressed soft bit data SB. By counting the number of pieces of "1" data, the difficulty level of the hard bit decoding processing can be determined. When the number of counts is less than the preset determination value, the memory controller 10 determines that there is a high possibility that the hard bit decoding processing will succeed, and can omit reading (data transfer) of the compressed soft bit data SB from the non-volatile memory 20. Therefore, in a case where there is a high possibility that the hard bit decoding processing will succeed, it is possible to avoid data transfer of the compressed soft bit data SB that is highly likely not to be used. As a result, an increase in the data transfer amount can be suppressed.

4. Fourth Embodiment

Next, a fourth embodiment will be described. In the fourth embodiment, a case where a memory cell transistor MC is a quad level cell (QLC) that stores 4-bit data including a lower bit, a middle bit, an upper bit, and a top bit will be described. Hereinafter, differences from the first to third embodiments will be mainly described.

Figure 22:
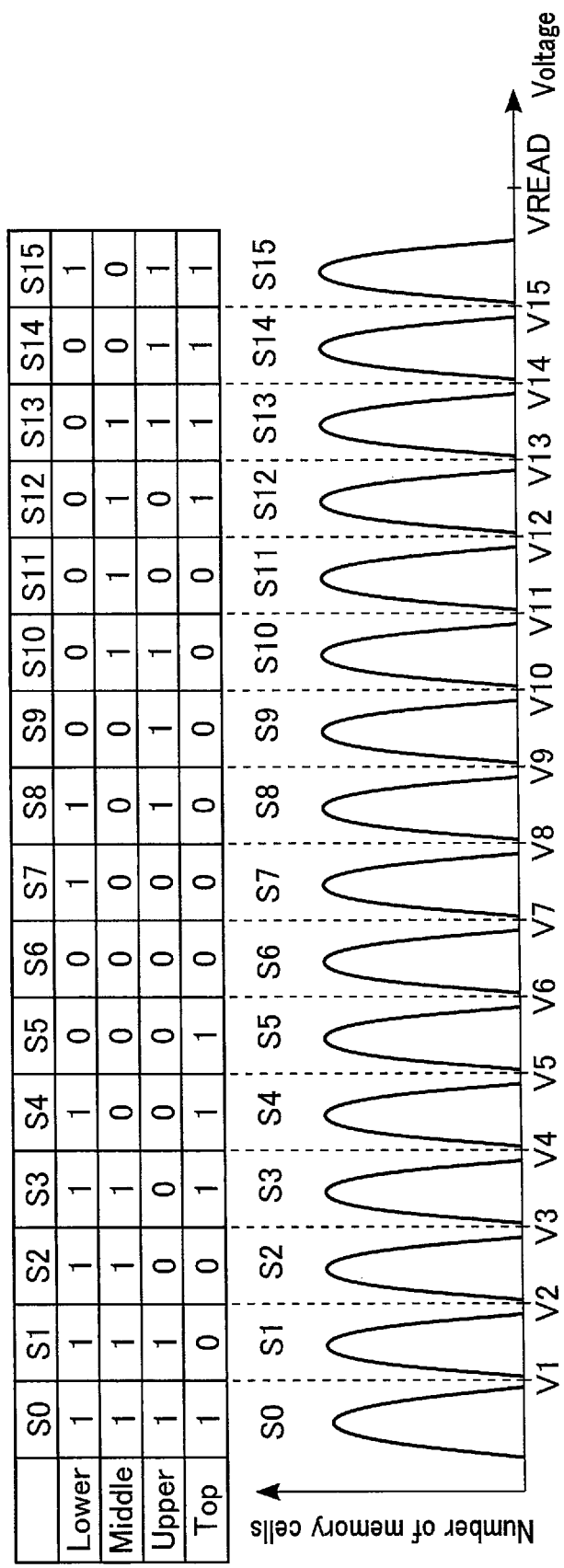
FIG. 22 is a diagram illustrating a relation between data allocation and a threshold voltage distribution of a quad level cell (QLC) included in a non-volatile memory according to a fourth embodiment.

4.1 Relation Between Threshold Voltage Distribution of Memory Cell Transistor and Data Allocation First, an example of the relation between the threshold voltage distribution of the memory cell transistor MC and the data allocation will be described with reference to FIG. 22. FIG. 22 is a diagram illustrating a relation between a threshold voltage distribution of the QLC and data allocation.

As illustrated in FIG. 22, a threshold voltage of each memory cell transistor MC takes a value included in any of discrete, for example, 16 distributions. Hereinafter, the 16 distributions are written as a "S0" state, a "S1" state, a "S2" state, a "S3" state, a "S4" state, a "S5" state, a "S6" state, a "S7" state, a "S8" state, a "S9" state, a "S10" state, a "S11" state, a "S12" state, a "S13" state, a "S14" state, and a "S15" state, respectively, in ascending order of threshold voltages.

The "S0" state corresponds to, for example, a data erase state. In addition, the "S1" to "S15" states correspond to a state in which charges are injected into a charge storage layer and data is written. In a write operation, verify voltages corresponding to the threshold voltage distributions are set to V1 to V15. In this case, these voltage values have a relation of $V1<V2<V3<V4<V5<V6<V7<V8<V9<V10<V11<V12<V13<V14<V15<Vread$.

More specifically, the threshold voltage included in the "S0" state is lower than the voltage V1.

The threshold voltage included in the "S1" state is equal to or higher than the voltage V1 and lower than the voltage V2. The threshold voltage included in the "S2" state is equal to or higher than the voltage V2 and lower than the voltage V3. The threshold voltage included in the "S3" state is equal to or higher than the voltage V3 and lower than the voltage V4. The threshold voltage included in the "S4" state is equal to or higher than the voltage V4 and lower than the voltage V5. The threshold voltage included in the "S5" state is equal to or higher than the voltage V5 and lower than the voltage V6. The threshold voltage included in the "S6" state is equal to or higher than the voltage V6 and lower than the voltage V7. The threshold voltage included in the "S7" state is equal to or higher than the voltage V7 and lower than the voltage V8. The threshold voltage included in the "S8" state is equal to or higher than the voltage V8 and lower than the voltage V9. The threshold voltage included in the "S9" state is equal to or higher than the voltage V9 and lower than the voltage V10. The threshold voltage included in the "S10" state is equal to or higher than the voltage V10 and lower than the voltage V11. The threshold voltage included in the "S11" state is equal to or higher than the voltage V11 and lower than the voltage V12. The threshold voltage included in the "S12" state is equal to or higher than the voltage V12 and lower than the voltage V13. The threshold voltage included in the "S13" state is equal to or higher than the voltage V13 and lower than the voltage V14. The threshold voltage included in the "S14" state is equal to or higher than the voltage V14 and lower than the voltage V15. The threshold voltage included in the "S15" state is equal to or higher than the voltage V15 and lower than the voltage VREAD.

As described above, each memory cell transistor MC has any one of the 16 threshold voltage distributions, so that it can take 16 types of states. By assigning these states to "0000" to "1111" in binary notation, each memory cell transistor MC can hold 4-bit data. Hereinafter, the 4-bit data is written as a lower bit, a middle bit, an upper bit, and a top bit, respectively. Further, a set of lower bits collectively written (or read) to the cell unit CU is written as a lower page. A set of middle bits is written as a middle page. A set of upper bits is written as an upper page. A set of top bits is written as a top page.

In the example of FIG. 22, data is allocated to the memory cell transistors MC included in each threshold voltage distribution in "top bit/upper bit/middle bit/lower bit" as follows.

"S0" state: "1111" data
"S1" state: "0111" data
"S2" state: "0011" data
"S3" state: "1011" data
"S4" state: "1001" data
"S5" state: "1000" data
"S6" state: "0000" data
"S7" state: "0001" data
"S8" state: "0101" data
"S9" state: "0100" data
"S10" state: "0110" data
"S11" state: "0010" data
"S12" state: "1010" data
"S13" state: "1110" data
"S14" state: "1100" data
"S15" state: "1101" data In a case where the data allocated as described above is read, the lower bit is determined by the read operation corresponding to the "S5" state, the "S7" state, the "S9" state, and the "S15" state. The middle bit is determined by the read operation corresponding to the "S4" state, the "S10" state, and the "S14" state. The upper bit is determined by the read operation corresponding to the "S2" state, the "S8" state, the "S11" state, and the "S13" state. The top bit is determined by the read operation corresponding to the "S1" state, the "S3" state, the "S6" state, and the "S12" state. That is, values of the lower bit, the middle bit, the upper bit, and the top bit are determined by the read operations corresponding to the four states, the three states, the four states, and the four states, respectively. Hereinafter, such data allocation is written as "4-3-4-4 code". Note that the data allocation is not limited to the 4-3-4-4 code.

4.2 Hard Bit Data and Compressed Soft Bit Data of Each State

Figure 23:
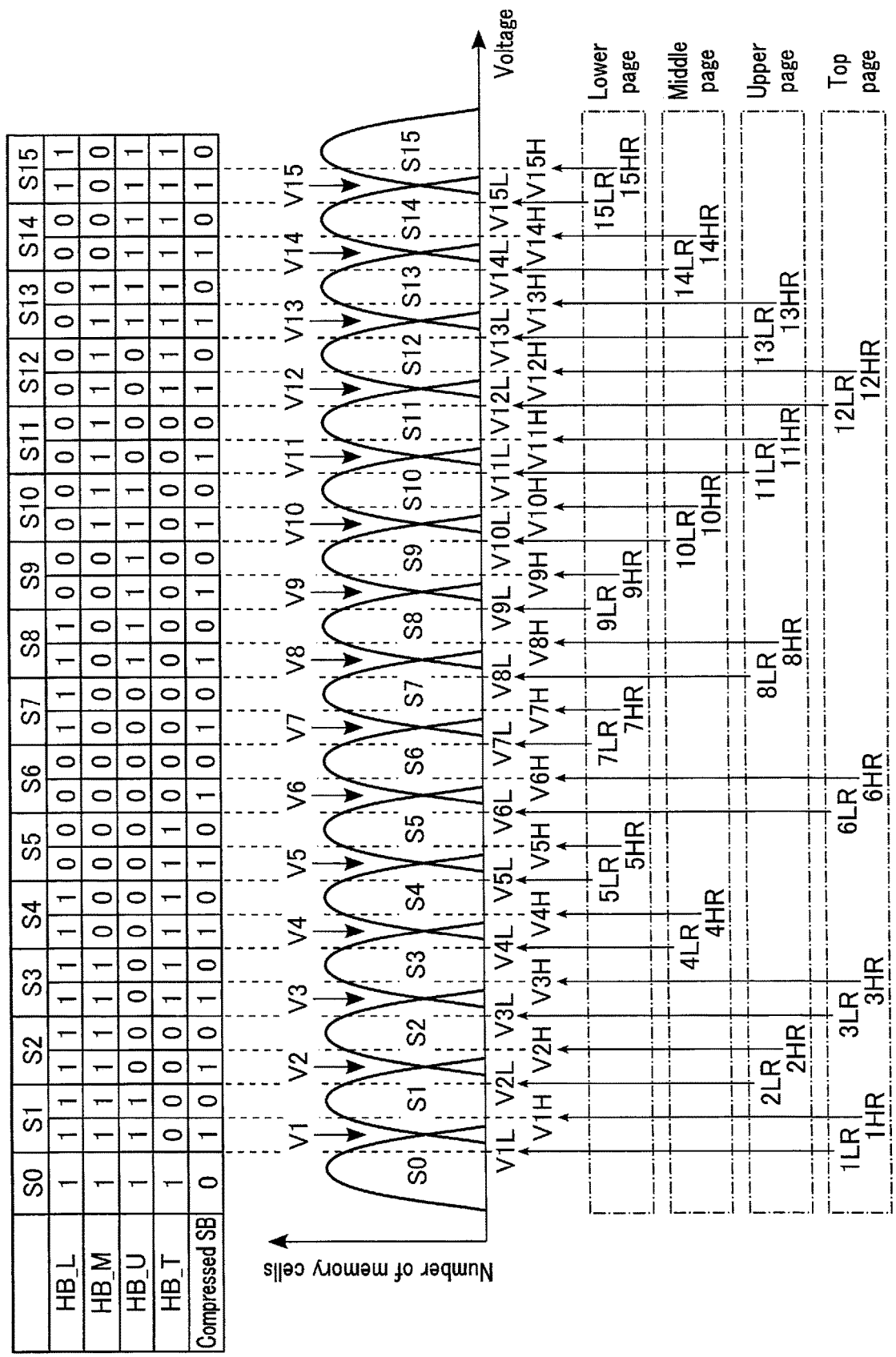
FIG. 23 is a diagram illustrating a relation between a threshold voltage distribution of a QLC and hard bit data and compressed soft bit data in the memory system according to the fourth embodiment.

Next, hard bit data HB and soft bit data SB of each state will be described with reference to FIG. 23. FIG. 23 is a diagram illustrating a relation between the threshold voltage distribution of the QLC and the hard bit data HB and the compressed soft bit data SB.

As illustrated in FIG. 23, two read voltages corresponding to the "S1" state are set to a voltage V1L and a voltage V1H. Two read voltages corresponding to the "S2" state are set to a voltage V2L and a voltage V2H. Two read voltages corresponding to the "S3" state are set to a voltage V3L and a voltage V3H. Two read voltages corresponding to the "S4" state are set to a voltage V4L and a voltage V4H. Two read voltages corresponding to the "S5" state are set to a voltage V5L and a voltage V5H. Two read voltages corresponding to the "S6" state are set to a voltage V6L and a voltage V6H. Two read voltages corresponding to the "S7" state are set to a voltage V7L and a voltage V7H. Two read voltages corresponding to the "S8" state are set to a voltage V8L and a voltage V8H. Two read voltages corresponding to the "S9" state are set to a voltage V9L and a voltage V9H. Two read voltages corresponding to the "S10" state are set to a voltage V10L and a voltage V10H. Two read voltages corresponding to the "S11" state are set to a voltage V11L and a voltage V11H. Two read voltages corresponding to the "S12" state are set to a voltage V12L and a voltage V12H. Two read voltages corresponding to the "S13" state are set to a voltage V13L and a voltage V13H. Two read voltages corresponding to the "S14" state are set to a voltage V14L and a voltage V14H. Two read voltages corresponding to the "S15" state are set to a voltage V15L and a voltage V15H.

These voltages have a relation of $V1L<V1<V1H<V2L<V2<V2H<V3L<V3<V3H<V4L<V4<V4H<V5L<V5<V5H<V6L<V6<V6H<V7L<V7<V7H<V8L<V8<V8H<V9L<V9<V9H<V10L<V10<V10H<V11L<V11<V11H<V12L<V12<V12H<V13L<V13<V13H<V14L<V14<V14H<V15L<V15<V15H<VREAD$.

The read operation using the voltage V1L is written as 1LR read. The read operation using the voltage V1H is written as 1HR read. The read operation using the voltage V2L is written as a 2LR read. The read operation using the voltage V2H is written as 2HR read. The read operation using the voltage V3L is written as 3LR read. The read operation using the voltage V3H is written as 3HR read. The read operation using the voltage V4L is written as a 4LR read. The read operation using the voltage V4H is written as 4HR read. The read operation using the voltage V5L is written as 5LR read. The read operation using the voltage V5H is written as 5HR read. The read operation using the voltage V6L is written as a 6LR read. The read operation using the voltage V6H is written as 6HR read. The read operation using the voltage V7L is written as a 7LR read. The read operation using the voltage V7H is written as 7HR read. The read operation using the voltage V8L is written as an 8LR read. The read operation using the voltage V8H is written as 8HR read. The read operation using the voltage V9L is written as a 9LR read. The read operation using the voltage V9H is written as 9HR read. The read operation using the voltage V10L is written as 10LR read. The read operation using the voltage V10H is written as 10HR read. The read operation using the voltage V11L is written as 11LR read. The read operation using the voltage V11H is written as 11HR read. The read operation using the voltage V12L is written as 12LR read. The read operation using the voltage V12H is written as 12HR read. The read operation using the voltage V13L is written as 13LR read. The read operation using the voltage V13H is written as 13HR read. The read operation using the voltage V14L is written as 14LR read. The read operation using the voltage V14H is written as 14HR read. The read operation using the voltage V15L is written as 15LR read. The read operation using the voltage V15H is written as 15HR read.

In the read operation of the lower page, eight read operations of the 5LR read, the 5HR read, the 7LR read, the 7HR read, the 9LR read, the 9HR read, the 15LR read, and the 15HR read are executed. The hard bit data HB_L is data determined by the 5LR read, the 7LR read, the 9LR read, and the 15LR read. The soft bit data SB_L is based on an XOR calculation of the hard bit data HE L and data determined by the 5HR read, the 7HR read, the 9HR read, and the 15HR read.

In the read operation of the middle page, six read operations of the 4LR read, the 4HR read, the 10LR read, the 10HR read, the 14LR read, and the 14HR read are executed. The hard bit data HB_M is data determined by the 5LR read, the 10LR read, and the 14LR read. The soft bit data SB_M is based on an XOR calculation of the hard bit data HB_M and data determined by the 4HR read, the 10HR read, and the 14HR read.

In the read operation of the upper page, eight read operations of the 2LR read, the 2HR read, the 8LR read, the 8HR read, the 11LR read, the 11HR read, the 13LR read, and the 13HR read are executed. The hard bit data HB_U is data determined by the 2LR read, the 8LR read, the 11LR read, and the 13LR read. The soft bit data SB_U is based on an XOR calculation of the hard bit data HB_U and data determined by the 2HR read, the 8HR read, the 11HR read, and the 13HR read.

In the read operation of the top page, eight read operations of the 1LR read, the 1HR read, the 3LR read, the 3HR read, the 6LR read, the 6HR read, the 12LR read, and the 12HR read are executed. The hard bit data HB_T is data determined by the 1LR read, the 3LR read, the 6LR read, and the 12LR read. The soft bit data SB_T is based on an XOR calculation of the hard bit data HB_T and data determined by the 1HR read, the 3HR read, the 6HR read, and the 12HR read.

The compressed soft bit data SB is data calculated by performing an OR calculation on the soft bit data SB_L, SB_M, SB_U, and SB_T. Therefore, a data size of the hard bit data HB_L, a data size of the hard bit data HB_M, a data size of the hard bit data HB_U, a data size of the hard bit data HB_T, a data size of the soft bit data SB_L, a data size of the soft bit data SB_M, a data size of the soft bit data SB_U, a data size of the soft bit data SB_T, and a data size of the compressed soft bit data SB are the same size.

In the example of FIG. 23, the threshold voltages of the memory cell transistors MC are divided into 31 sections to correspond to 30 read voltages. A combination of "hard bit data HB_T/HB_U/HM M/HB_L" and "compressed soft bit data SE" of each section of each state is as follows.

"S0" state (lower than voltage V1L): "1111", "0"
"S1" state (equal to or higher than voltage V1L and lower than voltage V1H): "0111", "1"
"S1" state (equal to or higher than voltage V1H and lower than voltage V2L): "0111", "0"
"S2" state (equal to or higher than voltage V2L and lower than voltage V2H): "0011", "1"
"S2" state (equal to or higher than voltage V2H and lower than voltage V3L): "0011", "0"
"S3" state (equal to or higher than voltage V3L and lower than voltage V3H): "1011", "1"
"S3" state (equal to or higher than voltage V3H and lower than voltage V4L): "1011", "0"
"S4" state (equal to or higher than voltage V4L and lower than voltage V4H): "1001", "1"
"S4" state (equal to or higher than voltage V4H and lower than voltage V5L): "1001", "0"
"S5" state (equal to or higher than voltage V5L and lower than voltage V5H): "1000", "1"
"S5" state (equal to or higher than voltage V5H and lower than voltage V6L): "1000", "0"
"S6" state (equal to or higher than voltage V6L and lower than voltage V6H): "0000",
"S6" state (equal to or higher than voltage V6H and lower than voltage V7L): "0000", "0"
"S7" state (equal to or higher than voltage V7L and lower than voltage V7H): "0001", "1"
"S7" state (equal to or higher than voltage V7H and lower than voltage V8L): "0001", "0"
"S8" state (equal to or higher than voltage V8L and lower than voltage V8H): "0101", "1"
"S8" state (equal to or higher than voltage V8H and lower than voltage V9L): "0101", "0"
"S9" state (equal to or higher than voltage V9L and lower than voltage V9H): "0100", "1"
"S9" state (equal to or higher than voltage V9H and lower than voltage V10L): "0100", "0"
"S10" state (equal to or higher than voltage VIOL and lower than voltage V10H): "0110", "1"
"S10" state (equal to or higher than voltage V10H and lower than voltage V11L): "0110", "0"
"S11" state (equal to or higher than voltage V11L and lower than voltage V11H): "0010", "1"
"S11" state (equal to or higher than voltage V11H and lower than voltage V12L): "0010", "0"
"S12" state (equal to or higher than voltage V12L and lower than voltage V12H): "1010", "1"
"S12" state (equal to or higher than voltage V12H and lower than voltage V13L): "1010", "0"
"S13" state (equal to or higher than voltage V13L and lower than voltage V13H): "1110", "1"
"S13" state (equal to or higher than voltage V13H and lower than voltage V14L): "1110", "0"
"S14" state (equal to or higher than voltage V14L and lower than voltage V14H): "1100", "1"
"S14" state (equal to or higher than voltage V14H and lower than voltage V15L): "1100", "0"
"S15" state (equal to or higher than voltage V15L and lower than voltage V15H): "1101", "1"
"S15" state (equal to or higher than voltage V15H and lower than voltage VEAD): "1101", "0"

4.3 Method for Restoring Compressed Soft Bit

Figure 24:
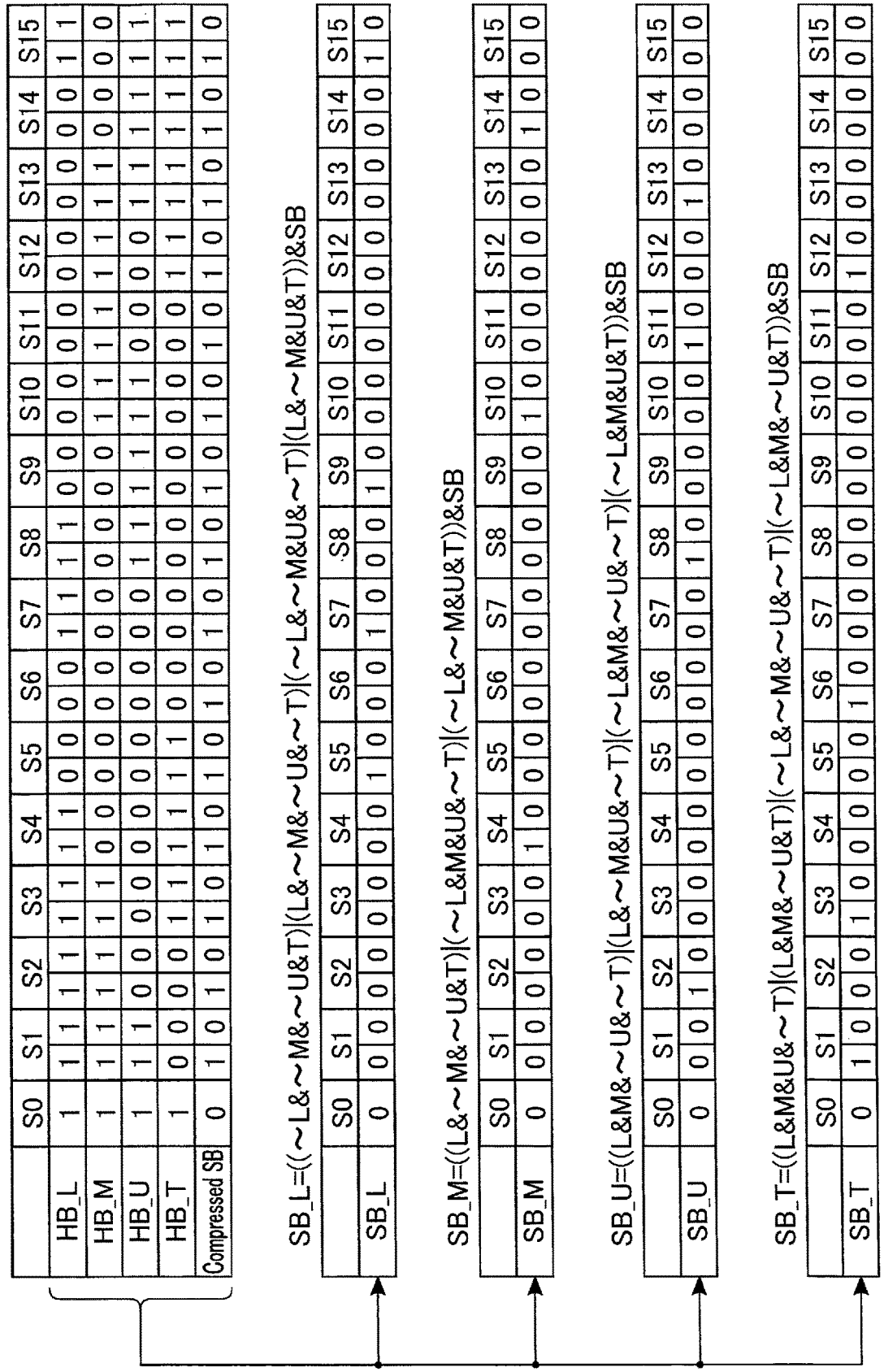
FIG. 24 is a diagram illustrating restoration processing of soft bit data SB_L, SB_M, SB_U, and SB_T in the memory system according to the fourth embodiment.

Next, a method for restoring the compressed soft bit data SB will be described with reference to FIG. 24. FIG. 24 is a diagram illustrating restoration processing of the soft bit data SB_L, SB_M, SB_U, and SB_T.

Positions (states) at which "1" data of the soft bit data SB_L, SB_M, SB_U, and SB_T can be generated are mutually exclusive. In addition, a combination of the hard bit data HB_L, HB_M, HB_U, and HB_T and a combination of the soft bit data SB_L, SB_M, SB_U, and SB_T can be defined on a one-to-one basis. By using these, the soft bit data SB of each page is restored from the hard bit data HB_L, HB_M, HB_U, and HB_T and the compressed soft bit data SB.

As illustrated in FIG. 24, an SB restoration circuit 163 receives the hard bit data HB_L, HB_M, HB_U, and HB_T and the compressed soft bit data SB from the non-volatile memory 20. When are restored, The SB decoder 1006 executes the following calculation to restore the soft bit data SB_L, SB_M, SB_U, and SB_T. Note that, in the following arithmetic expression, "|" indicates an OR calculation, and "~" indicates inverted data. In addition, in the following arithmetic expression, the hard bit data HB_L, HB_M, HB_U, and HB_T are simply written as "L", "M", "U", and "T", respectively.

$$SB\_L=((\sim L\&\sim M\&\sim U\&T)|(L\&\sim M\&\sim U\&\sim T)|(\sim L\&\sim M\&U\&\sim T)|(L\&\sim M\&U\&T))\&SB$$

$$SB\_M=HL\&\sim M\&\sim U\&T)|(\sim L\&M\&U\&\sim T)|(\sim 1,\&\sim M\&U\&T))\&SB$$

$$SB\_U=((L\&M\&\sim U\&\sim T)|(L\&\sim M\&U\&\sim T)|(\sim L\&M\&\sim U\&\sim T)|(\sim L\&M\&U\&T))\&SB$$

$$SB\_T=((L\&M\&U\&\sim T)|(L\&M\&\sim U\&T)|(\sim L\&\sim M\&\sim U\&\sim T)|(\sim L\&M\&\sim U\&T))\&SB$$

The soft bit data SB_L, SB_M, SB_U, and SB_T described using FIG. 24 are restored by the above arithmetic expression. Note that the arithmetic expression can be appropriately changed based on data allocation in the memory cell transistor MC.

4.4 Effects According to Present Embodiment

With the configuration according to the present embodiment, effects similar to those of the first embodiment can be obtained.

Note that the present embodiment can be combined with the second embodiment or the third embodiment.

5. Others

According to the above embodiments, the memory system comprising: a non-volatile memory (20) including a plurality of memory cells (MC) each capable of storing at least a first bit (lower bit) and a second bit (middle bit), and configured to calculate third soft bit data (compressed SB) based on a logical sum calculation using at least first soft bit data (SB_L) corresponding to the first bit and second soft bit data (SB_M) corresponding to the second bit; and a memory controller configured to restore the first soft bit data and the second soft bit data based on at least first hard bit data (HB_L) corresponding to the first bit, second hard bit data (HB_M) corresponding to the second bit, and the third soft bit data.

By applying the above embodiments, it is possible to provide a memory system capable of suppressing an increase in the amount of data transfer between the memory controller and the non-volatile memory.

Note that the embodiments are not limited to the forms described above, and various modifications can be made.

For example, in the third embodiment, the case where any of the hard bit decoding processing and the soft bit decoding processing is executed based on the determination result of the number of counts has been described, but the operation based on the determination result of the number of counts is not limited thereto. For example, the determination of the number of counts may be executed when the hard bit decoding processing fails. In this case, execution or non-execution of the soft bit decoding processing may be determined based on the determination result.

For example, in the above embodiments, the case where a plurality of pieces of soft bit data SB of a plurality of pages of one cell unit CU is compressed into one page data has been described, but the present disclosure is not limited thereto. For example, a plurality of pieces of soft bit data SB of a plurality of cell units CU may be compressed into one piece of page data.

Furthermore, the "coupling" in the above embodiments also includes a state in which the coupling is indirectly made with another element, for example, a transistor or a resistor interposed therebetween.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a non-volatile memory including a plurality of memory cells each capable of storing at least a first bit and a second bit, and configured to calculate third soft bit data via lossless compression by performing a logical sum calculation using at least first soft bit data corresponding to the first bit and second soft bit data corresponding to the second bit; and
a memory controller configured to fully restore the first soft bit data and the second soft bit data based on at least first hard bit data corresponding to the first bit, second hard bit data corresponding to the second bit, and the third soft bit data.

2. The memory system according to claim 1, wherein
the memory controller is configured to read the first hard bit data, the second hard bit data, and the third soft bit data from the non-volatile memory, and is configured not to read the first soft bit data and the second soft bit data from the non-volatile memory.

3. The memory system according to claim 1, wherein
the first bit is determined by at least a first read operation based on a first state,
the first read operation includes a second read operation using a first voltage corresponding to the first state and a third read operation using a second voltage corresponding to the first state and higher than the first voltage,
the first hard bit data is determined based on at least the second read operation, and
the first soft bit data is determined based on a calculation of the first hard bit data and a result of the third read operation.

4. The memory system according to claim 3, wherein
the first soft bit data is determined based on an exclusive logical sum calculation of the first hard bit data and the result of the third read operation.

5. The memory system according to claim 3, wherein
the memory controller is configured to transmit a first command set including a first command to the non-volatile memory, and
the non-volatile memory is configured to execute the first read operation and the calculation of the first soft bit data based on the first command.

6. The memory system according to claim 1, wherein
the memory controller is configured to execute soft bit decoding processing based on at least the first hard bit data, the second hard bit data, the first soft bit data, and the second soft bit data.

7. The memory system according to claim 6, wherein
the memory controller is configured to execute hard bit decoding processing based on at least the first hard bit data and the second hard bit data, and is configured to execute the soft bit decoding processing when the hard bit decoding processing fails.

8. The memory system according to claim 1, wherein
the non-volatile memory further includes a counter counting the number of pieces of first logic level data of the third soft bit data, and
the memory controller is configured to read the third soft bit data from the non-volatile memory when the number is equal to or larger than a preset determination value, and is configured not to read the third soft bit data from the non-volatile memory when the number is less than the determination value.

9. A memory system comprising:
a non-volatile memory including a plurality of memory cells each capable of storing at least a first bit, a second bit, and a third bit; and
a memory controller configured to control the non-volatile memory, wherein
the non-volatile memory is configured to output first hard bit data of the first bit, second hard bit data of the second bit, third hard bit data of the third bit, and first soft bit data related to the first bit, the second bit, and the third bit to the memory controller,
the first soft bit data is compressed via lossless compression by performing a logical sum calculation on the first soft bit data, and
the memory controller is configured to execute error correction processing using the first hard bit data, the second hard bit data, the third hard bit data, and the first soft bit data.

10. The memory system according to claim 9, wherein
a data size of the first hard bit data, a data size of the second hard bit data, a data size of the third hard bit data, and a data size of the first soft bit data are the same size.

11. The memory system according to claim 9, wherein
the non-volatile memory is configured to calculate the first soft bit data based on a logical sum calculation using second soft bit data related to the first bit, third soft bit data related to the second bit, and fourth soft bit data related to the third bit.

12. The memory system according to claim 11, wherein
the memory controller is configured to:
restore the second soft bit data based on the first hard bit data and the first soft bit data;
restore the third soft bit data based on the second hard bit data and the first soft bit data; and
restore the fourth soft bit data based on the third hard bit data and the first soft bit data.

13. The memory system according to claim 11, wherein
the first bit is determined by at least a first read operation based on a first state,
the first read operation includes a second read operation using a first voltage corresponding to the first state and a third read operation using a second voltage corresponding to the first state and higher than the first voltage,
the first hard bit data is determined based on at least the second read operation, and
the second soft bit data is calculated based on a calculation of the first hard bit data and a result of the third read operation.

14. The memory system according to claim 11, wherein
the memory controller is configured to execute the error correction processing based on the first hard bit data, the second hard bit data, the third hard bit data, the second soft bit data, the third soft bit data, and the fourth soft bit data.

15. The memory system according to claim 14, wherein
the non-volatile memory further includes a counter counting the number of pieces of first logic level data of at least one of the first soft bit data, the second soft bit data, the third soft bit data, and the fourth soft bit data, and
the memory controller is configured to read the number, and read the first soft bit data from the non-volatile memory when the number is equal to or larger than a preset determination value.

16. A non-volatile memory comprising:
a plurality of memory cells each of that is capable of storing at least a first bit, a second bit, and a third bit;
a word line that is commonly coupled to the memory cells;
a plurality of bit lines coupled to the memory cells, respectively; and
a sense amplifier that is coupled to the bit lines, wherein
the sense amplifier is configured to generate first hard bit data of the first bit, second hard bit data of the second bit, third hard bit data of the third bit, and first soft bit data that is related to the first bit, the second bit, and the third bit and is compressed via lossless compression by performing a logical sum calculation on the first soft bit data.

17. The non-volatile memory according to claim 16, wherein
a data size of the first hard bit data, a data size of the second hard bit data, a data size of the third hard bit data, and a data size of the first soft bit data are the same size.

18. The non-volatile memory according to claim 16, wherein
the first soft bit data is calculated based on a logical sum calculation using second soft bit data related to the first bit, third soft bit data related to the second bit, and fourth soft bit data related to the third bit.

19. The non-volatile memory according to claim 18, wherein
the first bit is determined by at least a first read operation based on a first state,
the first read operation includes a second read operation using a first voltage corresponding to the first state and a third read operation using a second voltage corresponding to the first state and higher than the first voltage,
the first hard bit data is determined based on at least the second read operation, and
the second soft bit data is calculated based on a calculation of the first hard bit data and a result of the third read operation.

20. The non-volatile memory according to claim 18, further comprising:
a counter configured to count the number of pieces of first logic level data of at least one of the first soft bit data, the second soft bit data, the third soft bit data, and the fourth soft bit data.

* * * * *